(12) United States Patent
Butts et al.

(10) Patent No.: US 11,746,288 B2
(45) Date of Patent: Sep. 5, 2023

(54) METHOD TO ENHANCE PHOSPHOR ROBUSTNESS AND DISPERSABILITY AND RESULTING PHOSPHORS

(71) Applicant: General Electric Company, Schenectady, NY (US)

(72) Inventors: Matthew David Butts, Rexford, NY (US); James Edward Murphy, Niskayuna, NY (US); Mark Daniel Doherty, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 17/578,335

(22) Filed: Jan. 18, 2022

(65) Prior Publication Data

US 2022/0135876 A1 May 5, 2022

Related U.S. Application Data

(63) Continuation of application No. 16/419,206, filed on May 22, 2019, now Pat. No. 11,261,375.

(51) Int. Cl.
*C09K 11/61* (2006.01)
*C09K 11/02* (2006.01)
(Continued)

(52) U.S. Cl.
CPC ............ *C09K 11/617* (2013.01); *C09K 11/02* (2013.01); *G02B 6/005* (2013.01); *G02B 6/0026* (2013.01); *H01L 33/502* (2013.01); *H01L 33/507* (2013.01)

(58) Field of Classification Search
None
See application file for complete search history.

(56) References Cited

U.S. PATENT DOCUMENTS 3,576,756 A 4/1971 Russo
7,358,542 B2 4/2008 Radkov et al.
(Continued)

FOREIGN PATENT DOCUMENTS

CN 102220131 A 10/2011
JP 2003336045 A 11/2003
(Continued)

OTHER PUBLICATIONS

International Search Report and Written Opinion of the International Searching Authority, PCT/US2020/028946, dated Aug. 10, 2020.
(Continued)

*Primary Examiner* — Long Pham
(74) *Attorney, Agent, or Firm* — Armstrong Teasdale LLP

(57) ABSTRACT

Briefly, in one aspect, the present invention relates to processes for producing a stabilized $Mn^{4+}$ doped phosphor in solid form and a composition containing such doped phosphor. Such process may include combining a) a solution comprising at least one substance selected from the group consisting of: $K_2HPO_4$, an aluminum phosphate, oxalic acid, phosphoric acid, a surfactant, a chelating agent, or a combination thereof, with b) a $Mn^{4+}$ doped phosphor of formula I in solid form, where formula I may be: $A_x[MF_y]:Mn^{4+}$. The process can further include isolating the stabilized $Mn^{4+}$ doped phosphor in solid form. In formula I, A may be Li, Na, K, Rb, Cs, or a combination thereof. In formula I, M may be Si, Ge, Sn, Ti, Zr, Al, Ga, In, Sc, Y, La, Nb, Ta, Bi, Gd, or a combination thereof. In formula I, x is the absolute value of the charge of the $[MF_y]$ ion and y is 5, 6 or 7.

29 Claims, 4 Drawing Sheets

(51) Int. Cl.
*F21V 8/00* (2006.01)
*H01L 33/50* (2010.01)

(56) References Cited

U.S. PATENT DOCUMENTS

| | | |
|---|---|---|
| 7,497,973 B2 | 3/2009 | Radkov et al. |
| 7,648,649 B2 | 1/2010 | Radkov et al. |
| 7,985,723 B2 | 7/2011 | Savu et al. |
| 8,274,215 B2 | 9/2012 | Liu et al. |
| 8,906,724 B2 | 12/2014 | Murphy et al. |
| 9,111,464 B2 | 8/2015 | Bibl et al. |
| 9,222,017 B2 | 12/2015 | Koshida |
| 9,388,336 B2 | 7/2016 | Murphy et al. |
| 9,598,636 B2 | 3/2017 | Kaneyoshi et al. |
| 9,627,437 B1 | 4/2017 | Ulmer et al. |
| 9,879,178 B2 | 1/2018 | Jin et al. |
| 10,020,430 B2 | 7/2018 | Nguyen et al. |
| 10,793,773 B2 | 10/2020 | Du et al. |
| 2002/0195927 A1 | 12/2002 | Groen et al. |
| 2012/0064134 A1 | 3/2012 | Bourke, Jr. et al. |
| 2012/0256125 A1 | 10/2012 | Kaneyoshi et al. |
| 2013/0148376 A1 | 6/2013 | Nick et al. |
| 2014/0339495 A1 | 11/2014 | Bibl |
| 2015/0008463 A1 | 1/2015 | Yoshida |
| 2015/0301402 A1 | 10/2015 | Kimura et al. |
| 2015/0329770 A1 | 11/2015 | Kaneyoshi et al. |
| 2016/0244663 A1 | 8/2016 | Murphy et al. |
| 2016/0289553 A1 | 10/2016 | Beers et al. |
| 2017/0130125 A1 | 5/2017 | Shibamoto et al. |
| 2017/0254943 A1 | 9/2017 | Murphy |
| 2017/0276997 A1 | 9/2017 | Yoshinaga |
| 2017/0329770 A1 | 11/2017 | Kozak et al. |
| 2017/0342278 A1 | 11/2017 | Zalich et al. |
| 2018/0163126 A1 | 6/2018 | Murphy et al. |
| 2018/0190827 A1 | 7/2018 | Okazaki et al. |
| 2018/0233632 A1 | 8/2018 | Yuan et al. |
| 2018/0265778 A1 | 9/2018 | Du et al. |
| 2019/0018273 A1 | 1/2019 | Park et al. |
| 2019/0088827 A1 | 3/2019 | Camardello et al. |
| 2019/0280165 A1 | 9/2019 | Camardello et al. |
| 2019/0292448 A1 | 9/2019 | Porob et al. |
| 2020/0028033 A1 | 1/2020 | Camardello et al. |
| 2020/0299574 A1 | 9/2020 | Hashizume |
| 2020/0301261 A1 | 9/2020 | Hashizume |
| 2020/0304764 A1 | 9/2020 | Hashizume |
| 2020/0369956 A1 | 11/2020 | Butts et al. |

FOREIGN PATENT DOCUMENTS

| | | |
|---|---|---|
| JP | 5375733 B2 | 12/2013 |
| JP | 5884717 B2 | 3/2016 |
| KR | 20010004094 A | 1/2001 |
| WO | 2018093832 A2 | 5/2018 |

OTHER PUBLICATIONS

Huang et al., "Highly stable K2SiF6: Mn4+K2SiF6 composite phosphor with narrow red emission for white LEDs.", ACS applied materials & interfaces, 2018, vol. 10, No. 21, pp. 18082-18092, <doi:10.1021/acsami.8b03893>.

Nguyen et al., "Waterproof Alkyl Phosphate Coated Fluoride Phosphors for Optoelectronic Materials", Angewandte. Communications,vol. 54, pp. 10862-10866, 2015.

Kikuyama et al., Surface Active Buffered Hydrogen Fluoride Having Excellent Wettability for ULSI Processing, IEEE Transactions on Semiconductor Manufacturing, vol. 3, No. 3, Aug. 1990, pp. 99-108.

METHOD TO ENHANCE PHOSPHOR ROBUSTNESS AND DISPERSABILITY AND RESULTING PHOSPHORS

CROSS-REFERENCE TO RELATED APPLICATIONS

This application is a continuation of U.S. application Ser. No. 16/419,206 filed May 22, 2019, now issued as U.S. Pat. No. 11,261,375, the entirety of which is incorporated by reference herein.

BACKGROUND

Red-emitting phosphors based on complex fluoride materials activated by $Mn^{4+}$, such as those described in U.S. Pat. Nos. 7,358,542, 7,497,973, and 7,648,649, can be utilized in combination with yellow/green emitting phosphors such as YAG:Ce to achieve warm white light (CCTs<5000 K on the blackbody locus, color rendering index (CRI)>80) from a blue light emitting diode (LED), equivalent to that produced by current fluorescent, incandescent and halogen lamps. These materials absorb blue light strongly and efficiently emit in a range between about 610 nm and 658 nm with little deep red/NIR emission. Therefore, luminous efficacy is maximized compared to red phosphors that have significant emission in the deeper red where eye sensitivity is poor. Quantum efficiency can exceed 85% under blue (440-460 nm) excitation. In addition, use of the red phosphors for displays can yield high gamut and efficiency.

Processes for preparing $Mn^{4+}$ doped complex fluoride phosphors with improved color stability are described in U.S. Pat. No. 8,906,724 and other patents and patent applications assigned to General Electric Company or Current. Yet there remains a need for even further improvements in stability and dispersibility of the complex fluoride phosphors, while maintaining excellent performance in lighting and display applications.

BRIEF DESCRIPTION

Briefly, in one aspect, the present invention relates to a process for producing a stabilized $Mn^{+4}$ doped phosphor in solid form. Such process may include combining a) a solution comprising at least one substance selected from the group consisting of: $K_2HPO_4$, an aluminum phosphate, oxalic acid, phosphoric acid, a surfactant, a chelating agent, or a combination thereof, with b) a $Mn^{+4}$ doped phosphor of formula I in solid form, where formula I may be: $A_x[MF_y]:Mn^{+4}$. The process can further include isolating the stabilized $Mn^{4+}$ doped phosphor in solid form. In formula I, A may be Li, Na, K, Rb, Cs, or a combination thereof. In formula I, M may be Si, Ge, Sn, Ti, Zr, Al, Ga, In, Sc, Y, La, Nb, Ta, Bi, Gd, or a combination thereof. In formula I, x is the absolute value of the charge of the $[MF_y]$ ion and y is 5, 6 or 7.

Another aspect of the present invention relates to a composition which includes a) at least one substance selected from the group consisting of: $K_2HPO_4$, an aluminum phosphate, oxalic acid, phosphoric acid, or a combination thereof, and b) a $Mn^{4+}$ doped phosphor of formula I, where formula I is: $A_x[MF_y]:Mn^{4+}$. In formula I, A may be Li, Na, K, Rb, Cs, or a combination thereof. In formula I, M may be Si, Ge, Sn, Ti, Zr, Al, Ga, In, Sc, Y, La, Nb, Ta, Bi, Gd, or a combination thereof. In formula I, x is the absolute value of the charge of the $[MF_y]$ ion and y is 5, 6 or 7.

Yet another aspect of the present invention is directed to a phosphor composition including phosphor particles and, on their surfaces, at least one surface composition selected from the group consisting of: 1) a composition including a phosphorus-containing moiety and a carbon-containing moiety; 2) a composition including a phosphorus-containing moiety and a metal fluoride; 3) a composition including a phosphorus-containing moiety and a carbon-containing moiety and a metal fluoride; and 4) a composition comprising the phosphorus-containing moiety free of an alkyl phosphate compound, where the phosphor particles comprise a $Mn^{4+}$ doped phosphor of formula I;

where A is Li, Na, K, Rb, Cs, or a combination thereof,
M is Si, Ge, Sn, Ti, Zr, Al, Ga, In, Sc, Y, La, Nb, Ta, Bi, Gd, or a combination thereof,
x is the absolute value of the charge of the $[MF_y]$ ion; y is 5, 6 or 7.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
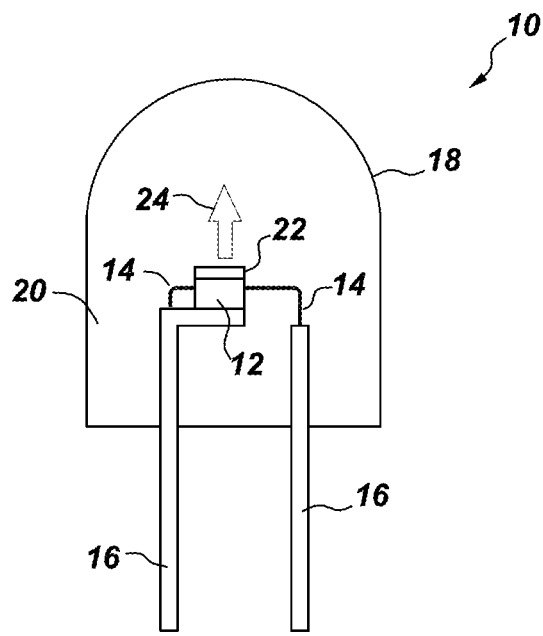
FIG. 1 is a schematic cross-sectional view of a LED package in accordance with one embodiment of the invention.

In one aspect, the present invention relates to processes for producing a stabilized $Mn^{4+}$ doped phosphor in solid form. Such processes may include combining a) a solution including at least one substance selected from the group consisting of: $K_2HPO_4$, an aluminum phosphate, oxalic acid, phosphoric acid, a surfactant, a chelating agent, or a combination thereof, with b) a $Mn^{4+}$ doped phosphor of formula I in solid form. In an embodiment, the amount of the substance mentioned above is 0.01-20% by weight relative to the amount of the $Mn^{4+}$ doped phosphor of formula I, such as 1% to 15%, and 2% to 10%.

In another aspect the present invention relates to a composition which includes a) at least one substance selected from the group consisting of: $K_2HPO_4$, an aluminum phosphate, oxalic acid, phosphoric acid, a surfactant, a chelating agent, or a combination thereof, and b) a $Mn^{4+}$ doped phosphor of formula I.

The $Mn^{4+}$ doped phosphors of formula I are complex fluoride materials, or coordination compounds, containing at least one coordination center surrounded by fluoride ions acting as ligands, and charge-compensated by counter ions as necessary. For example, in $K_2SiF_6:Mn^{4+}$, the coordination center is Si and the counterion is K. Complex fluorides are occasionally written as a combination of simple, binary fluorides but such a representation does not indicate the coordination number for the ligands around the coordination center. The square brackets (occasionally omitted for simplicity) indicate that the complex ion they encompass is a new chemical species, different from the simple fluoride ion. The activator ion ($Mn^{4+}$) also acts as a coordination center, substituting part of the centers of the host lattice, for example, Si. The host lattice (including the counter ions) may further modify the excitation and emission properties of the activator ion.

In particular embodiments, the coordination center of the phosphor, that is, M in formula I, is Si, Ge, Sn, Ti, Zr, or a combination thereof. More particularly, the coordination center may be Si, Ge, Ti, or a combination thereof. The counterion, or A in formula I, may be Na, K, Rb, Cs, or a combination thereof, more particularly K. Examples of phosphors of formula I include $K_2[SiF_6]:Mn^{4+}$, $K_2[TiF_6]:Mn^{4+}$, $K_2[SnF_6]:Mn^{4+}$, $Cs_2[TiF_6]:Mn^{4+}$, $Rb_2[TiF_6]$ $Mn^{4+}$, $Cs_2[SiF_6]:Mn^{4+}$, $Rb_2[SiF_6]:Mn^{4+}$, $Na_2[TiF_6]:Mn^{4+}$, $Na_2[ZrF_6]:Mn^{4+}$, $K_3[ZrF_7]:Mn^{4+}$, $K_3[BiF_6]:Mn^{4+}$, $K_3[YF_6]:Mn^{4+}$, $K_3[LaF_6]:Mn^{4+}$, $K_3[GdF_6]:Mn^{4+}$, $K_3[NbF_7]:Mn^{4+}$, $K_3[TaF_7]:Mn^{4+}$. In particular embodiments, the phosphor of formula I is $K_2SiF_6:Mn^{4+}$.

The amount of manganese in the $Mn^{4+}$ doped phosphors of formula I may range from about 1.2 mol % based on the total number of moles of Mn and M (such as Si) (about 0.3 wt % based on total phosphor weight) to about 21 mol % (about 5.1 wt %), particularly from about 1.2 mol % (about 0.3 wt %) to about 16.5 mol % (about 4 wt %). In particular embodiments, the amount of manganese may range from about 2 mol % (about 0.5 wt %) to 13.4 mol % (about 3.3 wt %), or from about 2 mol % to 12.2 mol % (about 3 wt %), or from about 2 mol % to 11.2 mol % (about 2.76 wt %), or from about 2 mol % to about 10 mol % (about 2.5 wt %), or from about 2 mol % to 5.5 mol % (about 1.4 wt %), or from about 2 mol % to about 3.0 mol % (about 0.75 wt %).

The $Mn^{4+}$ doped phosphor of formula I may be annealed to improve stability as described in U.S. Pat. No. 8,906,724 prior to combination with $K_2HPO_4$, an aluminum phosphate, oxalic acid, phosphoric acid, a surfactant, a chelating agent, or a combination thereof. In such embodiments, the product phosphor is held at an elevated temperature, while in contact with an atmosphere containing a fluorine-containing oxidizing agent. The fluorine-containing oxidizing agent may be $F_2$, HF, $SF_6$, $BrF_5$, $NH_4HF_2$, $NH_4F$, KF, $AlF_3$, $SbF_5$, $ClF_3$, $BrF_3$, $KrF_2$, $XeF_2$, $XeF_4$, $XeF_6$, $NF_3$, $SiF_4$, $PbF_2$, $ZnF_2$, $SnF_2$, $CdF_2$, a $C_1$-$C_4$ fluorocarbon, or a combination thereof. Examples of suitable fluorocarbons include $CF_4$, $C_2F_6$, $C_3F_8$, $CHF_3$, $CF_3CH_2F$, and $CF_2CHF$. In particular embodiments, the fluorine-containing oxidizing agent is $F_2$. The amount of oxidizing agent in the atmosphere may be varied to obtain a color stable phosphor, particularly in conjunction with variation of time and temperature. Where the fluorine-containing oxidizing agent is $F_2$, the atmosphere may include at least 0.5% $F_2$, although a lower concentration may be effective in some embodiments. In particular the atmosphere may include at least 5% $F_2$ and more particularly at least 20% $F_2$. The atmosphere may additionally include nitrogen, helium, neon, argon, krypton, xenon, in any combination with the fluorine-containing oxidizing agent. In particular embodiments, the atmosphere is composed of about 20% $F_2$ and about 80% nitrogen.

The temperature at which the phosphor is contacted with the fluorine-containing oxidizing agent at an elevated temperature may be a temperature in the range from about 200° C. to about 700° C., particularly from about 350° C. to about 600° C. during contact, and in some embodiments from about 500° C. to about 600° C. The phosphor is contacted with the oxidizing agent for a period of time sufficient to convert it to a color stable phosphor. Time and temperature are interrelated, and may be adjusted together, for example, increasing time while reducing temperature, or increasing temperature while reducing time. In particular embodiments, the time is at least one hour, particularly at least four hours, more particularly at least six hours, and most particularly at least eight hours. After holding at the elevated temperature for the desired period of time, the temperature in the furnace may be reduced at a controlled rate while maintaining the oxidizing atmosphere for an initial cooling period. The temperature may be reduced to about 200° C. with controlled cooling, then control may be discontinued if desired.

The manner of contacting the phosphor with the fluorine-containing oxidizing agent is not critical and may be accomplished in any way sufficient to convert the phosphor to a color stable phosphor having the desired properties. In some embodiments, the chamber containing the phosphor may be dosed and then sealed such that an overpressure develops as the chamber is heated, and in others, the fluorine and nitrogen mixture is flowed throughout the anneal process ensuring a more uniform pressure. In some embodiments, an additional dose of the fluorine-containing oxidizing agent may be introduced after a period of time.

The annealed phosphor may be treated with a saturated or nearly saturated solution of a composition of formula II in aqueous hydrofluoric acid

$$A_x[MF_y] \tag{II}$$

wherein

A is Li, Na, K, Rb, Cs, or a combination thereof,

M is Si, Ge, Sn, Ti, Zr, Al, Ga, In, Sc, Hf, Y, La, Nb, Ta, Bi, Gd, or a combination thereof, x is an absolute value of a charge of the [$MF_y$] ion; and y is 5, 6 or 7.

A nearly saturated solution contains about 1-5% excess aqueous HF added to a saturated solution. The concentration of HF in the solution ranges from about 25% (wt/vol) to about 70% (wt/vol), in particular from about 40% (wt/vol) to about 50% (wt/vol). Less concentrated solutions may result in reduced performance of the phosphor. The amount of treatment solution used ranges from about 2-30 ml/g product, particularly about 5-20 ml/g product, more particularly about 5-15 ml/g product. The treated annealed phosphor may be isolated by filtration, washed with solvents such as acetic acid and acetone to remove contaminants and traces of water, and stored under nitrogen.

After treatment, the phosphor may optionally be contacted with a fluorine-containing oxidizing agent in gaseous form at a second, lower temperature. The second temperature may be the same as the first temperature, or may be less than the first, ranging up to and including 225° C., particularly up to and including 100° C., and more particularly, up to and including 90° C. The time for contacting with the oxidizing agent may be at least one hour, particularly at least four hours, more particularly at least six hours, and most particularly at least eight hours. In a specific embodiment, the phosphor is contacted with the oxidizing agent for a period of at least eight hours at a temperature of about 90° C. The oxidizing agent may be the same as or different from that used in the first annealing step. In particular embodiments, the fluorine-containing oxidizing agent is $F_2$. More particularly, the atmosphere may include at least 20% $F_2$. The phosphor may be contained in a vessel having a non-metallic surface in order to reduce contamination of the phosphor with metals.

The $Mn^{4+}$ doped phosphors of formula I may have a core-shell structure composed of a core which includes the phosphor of formula I and a manganese-free shell or composite coating disposed on the core. The manganese-free composite coating includes a compound of formula III and a metal fluoride

wherein $A^1$ is H, Li, Na, K, Rb, Cs, or a combination thereof, $M^1$ is Si, Ge, Sn, Ti, Zr, Al, Ga, In, Sc, Y, La, Nb, Ta, Bi, Gd, or a combination thereof, x is the absolute value of the charge of the $[M^1F_y]$ ion; and y is 5, 6 or 7.

The metal fluoride may be one or more of the following: calcium fluoride, strontium fluoride, magnesium fluoride, yttrium fluoride, scandium fluoride, and lanthanum fluoride. In particular embodiments, the phosphor of formula I is $K_2[SiF_6]:Mn^{4+}$. The metal fluoride can be, in an embodiment, $MgF_2$. The core-shell $Mn^{4+}$ doped phosphors of formula I and methods for preparing them are described in WO 2018/093832. As stated above, the $Mn^{4+}$ doped phosphors of formula I may be combined with (or form part of a composition which is) a solution or suspension that includes one or more of the following substances: $K_2HPO_4$, an aluminum phosphate, oxalic acid, phosphoric acid, a surfactant, a chelating agent, or a combination thereof. $K_2HPO_4$, an aluminum phosphate, oxalic acid, phosphoric acid, a surfactant, a chelating agent, or a combination thereof shall be referred to herein as Substance. The weight ratio of the phosphor to the Substance may be from 200:1 to 1:1 and, more preferably, is from 50:1 to 4:1. Examples of suitable chelating agent include, but are not limited to, ammonium citrate, potassium citrate, iminodiacetic acid (IDA), and ethylenediaminetetraacetic acid (EDTA). The surfactant may be nonionic, anionic, or cationic, or a mixture thereof. Examples of suitable surfactants include, but are not limited to, aliphatic amines, fluorocarbon surfactants, stearic acid and stearate salts, and oleic acid and oleate salts. Suitable nonionic surfactants include polyoxyethylene sorbitan fatty acid esters, commercially available under the TWEEN® brand, fluorocarbon surfactants such as NOVEC™ ammonium fluoroalkylsulfonamide, available from 3M, and polyoxyethylene nonylphenol ethers. The surfactants (or other surface agents) can be one or more of polyoxyethylene octyl phenyl ether, potassium oleate, polyoxyethylene-polyoxypropylene block copolymer (such as that sold as Pluronic F-127); polyoxyethylene (20) sorbitan monolaurate (such as that sold as Tween 20), poly(acrylic acid sodium salt), potassium sorbate, sorbitan monooleate (such as that sold as Span 80), and sodium hexametaphosphate. Additional examples of suitable surfactants are described in US 2015/0329770, U.S. Pat. No. 7,985,723 and Kikuyama, et al., IEEE Transactions on Semiconductor Manufacturing, vol. 3, No. 3, August 1990, pp. 99-108. In particular, the substance may include $K_2HPO_4$. As stated above, the substance can also include a surfactant. The substance can include both the surfactant and $K_2HPO_4$.

The solution that the surfactant forms part of may include one or more of the following solvents: 1-octadecene, isonorbornyl acrylate, water, and propylene glycol monomethyl ether acetate. It is noted that the organic solutions of the present invention may include a minor amount of water. For example, there may be water present in the propylene glycol monomethyl ether acetate (less than 0.05% by Karl Fischer), and also a minor amount of water in the potassium oleate. If the surfactant is part of an aqueous solution, such aqueous solution can also include $H_2O_2$. If $H_2O_2$ is used, this can be in a range by weight of phosphor to $H_2O_2$ of 200:1 to 1:1 and, more preferably, from 50:1 to 3:1.

An LED package or light emitting assembly or lamp 10 that may be used as part of a display or lighting device or apparatus is shown in FIG. 1. LED package 10 includes a semiconductor radiation source, shown as LED chip 12, and leads 14 electrically attached to the LED chip. The leads 14 may be thin wires supported by a thicker lead frame(s) 16 or the leads may be self-supported electrodes and the lead frame may be omitted. The leads 14 provide current to LED chip 12 and thus cause it to emit radiation.

The lamp may include any semiconductor blue or UV light source that is capable of producing white light when its emitted radiation is directed onto the phosphor. In one embodiment, the semiconductor light source is a blue emitting LED doped with various impurities. Thus, the LED may comprise a semiconductor diode based on any suitable III-V, II-VI or IV-IV semiconductor layers and have an emission wavelength of about 250 to 550 nm. In particular, the LED may contain at least one semiconductor layer comprising GaN, ZnSe or SiC. For example, the LED may comprise a nitride compound semiconductor represented by the formula $In_iGa_jAl_kN$ (where $0 \le i$; $0 \le j$; $0 \le k$, and $i+j+k=1$) and have an emission wavelength greater than about 250 nm and less than about 550 nm. In particular embodiments, the chip is a near-uv or blue emitting LED having a peak emission wavelength from about 400 to about 500 nm. Such LED semiconductors are known in the art. The radiation source is described herein as an LED for convenience. However, as used herein, the term is meant to encompass all semiconductor radiation sources including, e.g., semiconductor laser diodes. Further, although the general discussion of the exemplary structures of the invention discussed herein is directed toward inorganic LED based light sources, it should be understood that the LED chip may be replaced by another radiation source unless otherwise noted and that any reference to semiconductor, semiconductor LED, or LED chip is merely representative of any appropriate radiation source, including, but not limited to, organic light emitting diodes.

In LED package 10, phosphor composition 22 is radiationally coupled to the LED chip 12. Radiationally coupled means that the elements are associated with each other so radiation from one is transmitted to the other. Phosphor composition 22 is deposited on the LED 12 by any appropriate method. For example, a suspension of the phosphor(s) can be formed and applied as a phosphor layer to the LED surface. In one such method, a silicone slurry in which the phosphor particles are randomly suspended is placed around the LED. This method is merely exemplary of possible positions of phosphor composition 22 and LED 12. Thus, phosphor composition 22 may be coated over or directly on the light emitting surface of the LED chip 12 by coating and drying the phosphor suspension over the LED chip 12. In the case of a silicone-based suspension, the suspension is cured at an appropriate temperature. Both the shell 18 and the encapsulant 20 should be transparent to allow white light 24 to be transmitted through those elements.

In other embodiments, phosphor composition 22 is interspersed within the encapsulant material 20, instead of being formed directly on the LED chip 12. The phosphor (in the form of a powder) may be interspersed within a single region of the encapsulant material 20 or throughout the entire volume of the encapsulant material. Blue light emitted by the LED chip 12 mixes with the light emitted by phosphor composition 22, and the mixed light appears as white light. If the phosphor is to be interspersed within the material of encapsulant 20, then a phosphor powder may be added to a polymer or silicone precursor, loaded around the LED chip 12, and then the polymer precursor may be cured to solidify the polymer or silicone material. Other known phosphor interspersion methods may also be used, such as transfer loading.

In yet another embodiment, phosphor composition 22 is coated onto a surface of the shell 18, instead of being formed over the LED chip 12. The phosphor composition is preferably coated on the inside surface of the shell 18, although the phosphor may be coated on the outside surface of the shell, if desired. Phosphor composition 22 may be coated on the entire surface of the shell or only a top portion of the surface of the shell. The UV/blue light emitted by the LED chip 12 mixes with the light emitted by phosphor composition 22, and the mixed light appears as white light. Of course, the phosphor may be located in any two or all three locations or in any other suitable location, such as separately from the shell or integrated into the LED.

Figure 2:
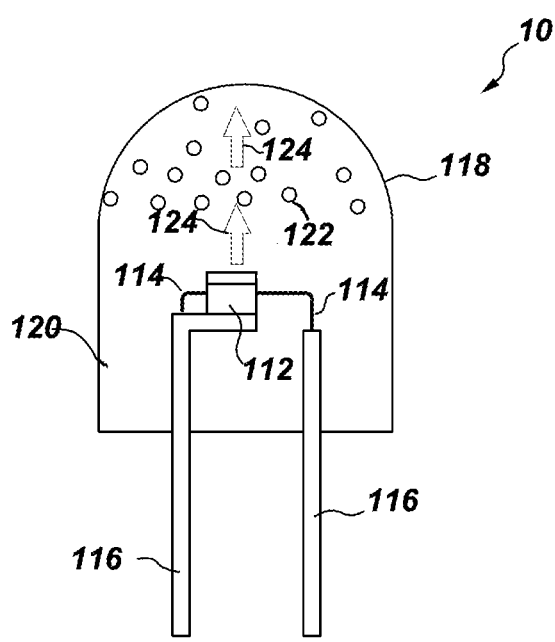
FIG. 2 is a schematic cross-sectional view of a LED package in accordance with another embodiment of the invention.

FIG. 2 illustrates a second structure of the system according to the present invention. Corresponding numbers from FIGS. 1-4 (e.g. 12 in FIGS. 1 and 112 in FIG. 2) relate to corresponding structures in each of the figures, unless otherwise stated. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material or throughout the entire volume of the encapsulant material. Radiation (indicated by arrow 124) emitted by the LED chip 112 mixes with the light emitted by the phosphor 122, and the mixed light appears as white light 124. If the phosphor is to be interspersed within the encapsulant material 120, then a phosphor powder may be added to a polymer precursor and loaded around the LED chip 112. The polymer or silicone precursor may then be cured to solidify the polymer or silicone. Other known phosphor interspersion methods may also be used, such as transfer molding.

Figure 3:
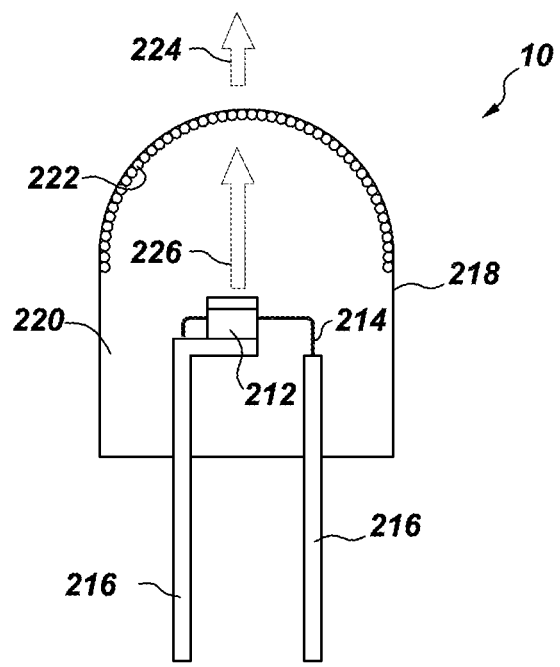
FIG. 3 is a schematic cross-sectional view of a LED package in accordance with yet another embodiment of the invention.

FIG. 3 illustrates a third possible structure of the system according to the present invention. The structure of the embodiment shown in FIG. 3 is similar to that of FIG. 1, except that the phosphor composition 222 is coated onto a surface of the envelope 218, instead of being formed over the LED chip 212. The phosphor composition 222 is preferably coated on the inside surface of the envelope 218, although the phosphor may be coated on the outside surface of the envelope, if desired. The phosphor composition 222 may be coated on the entire surface of the envelope, or only a top portion of the surface of the envelope. The radiation 226 emitted by the LED chip 212 mixes with the light emitted by the phosphor composition 222, and the mixed light appears as white light 224. Of course, the structures of FIGS. 1-3 may be combined, and the phosphor may be located in any two or all three locations, or in any other suitable location, such as separately from the envelope, or integrated into the LED.

In any of the above structures, the lamp 10 may also include a plurality of scattering particles (not shown), which are embedded in the encapsulant material. The scattering particles may comprise, for example, silica, alumina, zirconia, titania, zinc oxide, or a combination thereof. The scattering particles effectively scatter the directional light emitted from the LED chip, preferably with a negligible amount of absorption.

Figure 4:
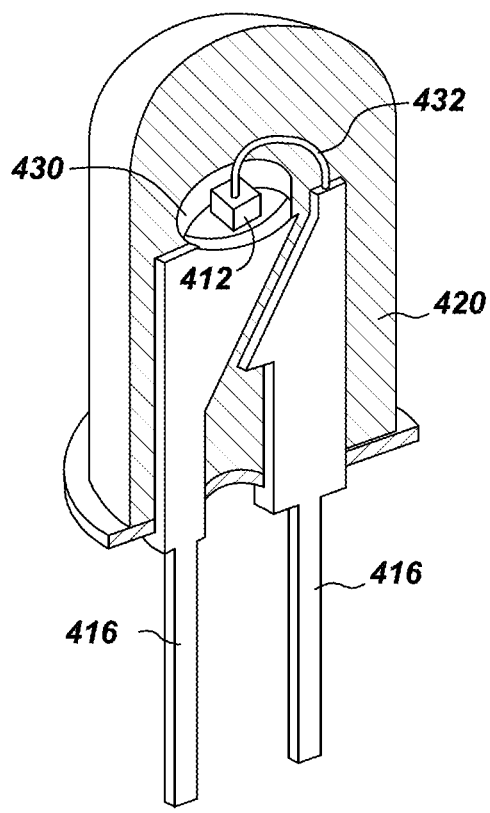
FIG. 4 is a cutaway side perspective view of a LED package in accordance with one embodiment of the invention.

As shown in a fourth structure in FIG. 4, the LED chip 412 may be mounted in a reflective cup 430. The cup 430 may be made from or coated with a dielectric material, such as silica, alumina, zirconia, titania, or other dielectric powders known in the art, or be coated by a reflective metal, such as aluminum or silver. The remainder of the structure of the embodiment of FIG. 4 is the same as those of any of the previous figures, and can include two leads 416, a conducting wire 432, and an encapsulant material 420. The reflective cup 430 is supported by the first lead 416 and the conducting wire 432 is used to electrically connect the LED chip 412 with the second lead 416.

Figure 5:
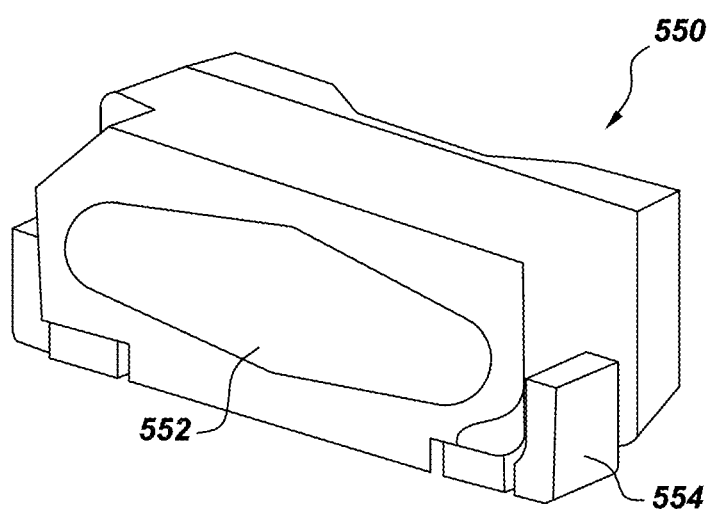
FIG. 5 is a schematic perspective view of a surface-mounted device (SMD) backlight LED.

Another structure is a surface mounted device (SMD) type light emitting diode 550, e.g. as illustrated in FIG. 5. This SMD is a "side-emitting type" and has a light-emitting window 552 on a protruding portion of a light guiding member 554 and is particularly useful for backlight applications. An SMD package may comprise an LED chip as defined above, and a phosphor material that is excited by the light emitted from the LED chip.

When used with an LED emitting light from 350 to 550 nm and one or more other appropriate phosphors, the resulting lighting system will produce a light having a white color.

Figure 6:
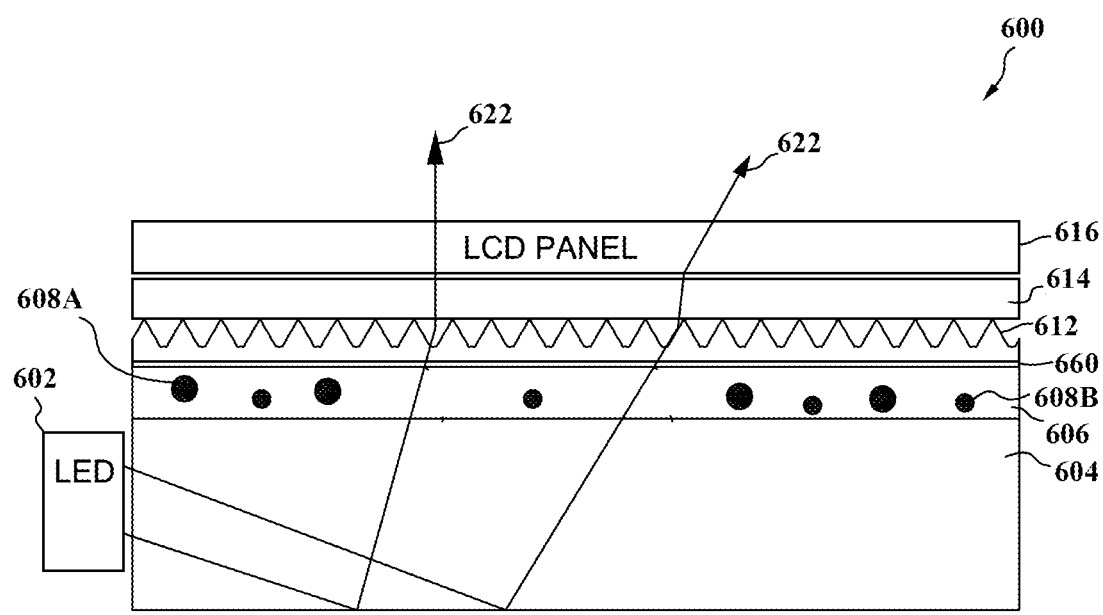
FIG. 6 illustrates a backlight unit or module.

In another embodiment, FIG. 6 illustrates a backlight unit or module 600 according to the present invention that includes light source 602, light guide panel 604, remote phosphor part in the form of a sheet or film 606, filter 660, and LCD panel 616. Backlight unit 600 may also optionally include a prism 612 and a brightness enhancing film 614. The light source 602 is a blue emitting LED. To produce even lighting, blue light from the light source 602 first passes through light guide panel 604 which diffuses the blue light. The LCD panel 616 also includes color filters arranged in subpixels, a front polarizer, a rear polarizer, and liquid crystal as well as electrodes. Generally, there is an air space between the LCD panel 616 and the brightness enhancing film 614. The brightness enhancing film 614 is a reflective polarizer film which increases efficiency by repeatedly reflecting any unpolarized light back, which would otherwise be absorbed by the LCD's rear polarizer. The brightness enhancing film 614 is placed behind the liquid crystal display panel 616 without any other film in-between. The brightness enhancing film 614 may be mounted with its transmission axis substantially parallel to the transmission axis of the rear polarizer. The brightness enhancing film 614 helps recycle the white light 622 that would normally be absorbed by the rear polarizer (not shown) of the liquid crystal panel 616, and thus increases the brightness of the liquid crystal display panel 616.

Remote phosphor part 606 includes particles 608A of a complex fluoride phosphor of formula I and particles 608B of a second light-emitting material dispersed in a polymer resin. It is "remote" in the sense that the primary light source and the phosphor material are separate elements, and the phosphor material is not integrated with the primary light source as a single element. Primary light is emitted from the primary light source and is travels through one or more external media to radiationally couple the LED light source to the phosphor material. It will be appreciated by those skilled in the art that a backlight unit according to the present invention may vary in configuration. For example, a direct lit configuration may be used. The prism 612 may also be removed or substituted by other brightness enhancement component in an alternative embodiment. The brightness enhancing film 614 may be removed if desired.

Figure 7:
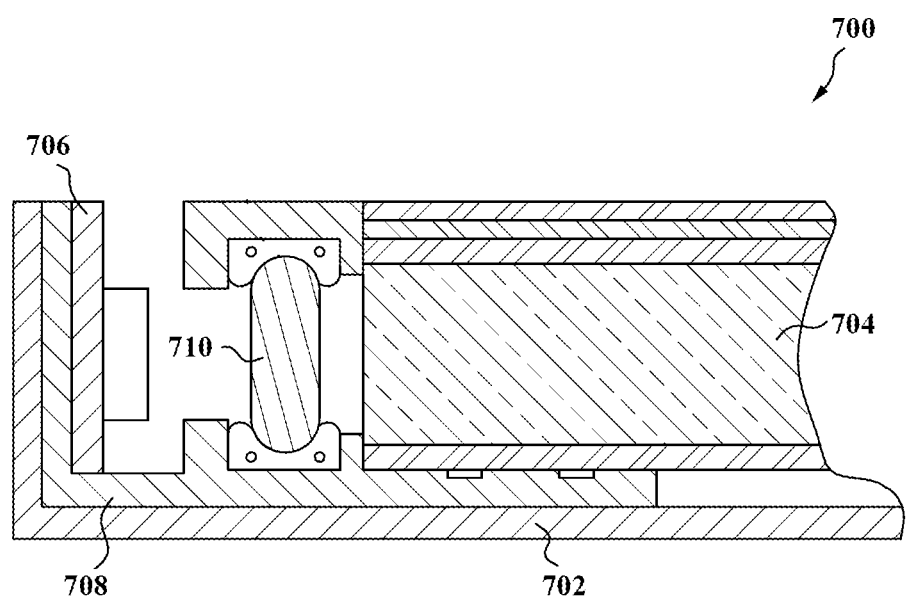
FIG. 7 illustrates a backlight unit or module.

In another embodiment, FIG. 7 shows a backlight unit 700 that includes backplane 702, light guide panel 704, LED light source 706, mounting bracket 708, and a remote phosphor package in the form of a strip 710, mounted in the backplane 702. The remote phosphor part 710 is mounted via mounting bracket 708 between light guide panel 704 and LED light source 706, whereby light emitting from the backlight source 706 is transmitted through part 710 and then enters the light guide plate 704. The backlight unit may further include a bottom reflector plate arranged between light guide panel 704 and the backplane 702 and an optical film assembly arranged above the light guide plate 704.

The LED radiationally coupled with the stabilized $Mn^{4+}$ doped phosphor may form part of a display device. The display device may include the $Mn^{4+}$ doped phosphor radiationally coupled to a light emitting diode, including a mini light emitting diode or a micro light emitting diode which emits light in the blue spectrum. A micro light emitting diode (also known as a micro LED, microLED, micro-LED, mLED, and pLED), is a technology utilized in displays in which there may be at least one small LED device for each pixel on a screen, or there may be at least more than one small LED device per pixel, and those LED devices may be coupled to red and green phosphors, respectively. Such a display device may include a backlighting unit and a) the stabilized $Mn^{4+}$ doped phosphor being part of the back lighting unit of the display device and being in direct or indirect contact with the LED or micro LED, or b) the stabilized $Mn^{4+}$ doped phosphor being part of the back lighting unit and being remotely coupled to the LED or micro LED, and optionally being in the form of a film. The stabilized $Mn^{4+}$ doped phosphor may be operably connected to the back lighting unit through at least one filter, and the back lighting unit contains the light emitting diode or the micro light emitting diode. In the display device, the $Mn^{4+}$ doped phosphor may be operably connected to or part of a back lighting unit of the display device in any way that is known in the art.

In some embodiments, the $Mn^{4+}$ doped phosphors according to the present invention are used in direct emission display devices that include arrays of microLEDs having dimensions on the scale of 1 to 300 μm or, more specifically, 1 to 100 μm, and even the scale of 1 to 50 μm, 1 to 20 μm, or 1 to 10 μm. Exemplary methods for fabricating direct emission display devices that include phosphor particles in a wavelength conversion layer coupled to the microLEDs are described in U.S. Pat. Nos. 9,111,464, and 9,627,437, and both of these patents are incorporated by reference herein in their entireties. Devices that include a backlight unit or direct emission display according to the present invention include, but are not limited to, TVs, computers, smartphones, tablet computers and other handheld devices that have a display including a semiconductor light source; and a $Mn^{4+}$ doped phosphor according to the present invention. In an embodiment, the phosphor particles of the present invention are a part of a device which comprises an LED, quantum dots, a mini LED, or a micro LED. A mini LED is an LED of a size between 50 μm and 300 μm. The display device according to the present invention may be a television, a computer monitor, a cellular or conventional phone, a digital photo frame, a tablet, an automotive display, an e-book reader, an electronic dictionary, a digital camera, an electronic keyboard, or a gaming device, or any other electronic device with a screen.

Devices according to the present invention may include one or more other light emitting materials in addition to a $Mn^{4+}$ doped phosphor. When used in a lighting device or apparatus in combination with a blue or near UV LED emitting radiation in the range of about 250 to 550 nm, the resultant light emitted by the assembly may be a white light. Other phosphors or quantum dot (QD) materials, such as green, blue, yellow, red, orange, or other color phosphors or QD materials may be used in a blend to customize the color of the resulting light and produce specific spectral power distributions. In other embodiments, the materials may be physically separated in a multilayered structure or may be present in one or more blends in a multilayered structure. In FIGS. 1-5, phosphor composition 22 may be a single layer blend or a multilayered structure containing one or more phosphors or QD materials in each layer. In microLED direct emission display devices, individual microLEDs may be separately coupled to a $Mn^{4+}$ doped phosphor and other phosphors or quantum dot (QD) materials to yield light having desired specifications.

Suitable phosphors for use in devices according to the present invention, along with a $Mn^{4+}$ doped phosphor include, but are not limited to:

$((Sr_{1-z}(Ca, Ba, Mg, Zn)_z)_{1-(x+w)}(Li, Na, K, Rb)_w Ce_x)_3 (Al_{1-y}Si_y)O_{4+y+3(x-w)}F_{1-y-3(x-w)}$, $0 < x \leq 0.10$, $0 \leq y \leq 0.5$, $0 \leq z \leq 0.5$, $0 \leq w \leq x$;

$(Ca, Ce)_3 Sc_2 Si_3 O_{12}$ (CaSiG);

$(Sr,Ca,Ba)_3 Al_{1-x} Si_x O_{4+x} F_{1-x}:Ce^{3+}$ (SASOF));

$(Ba,Sr,Ca)_5(PO_4)_3(Cl,F,Br,OH):Eu^{2+},Mn^{2+}$;

$(Ba,Sr,Ca)BPO_5:Eu^{2+},Mn^{2+}$;

$(Sr,Ca)_{10}(PO_4)_6 * nB_2O_3:Eu^{2+}$ (wherein $0 < n \leq 1$);

$Sr_2Si_3O_8 * 2SrCl_2:Eu^{2+}$;

$(Ca,Sr,Ba)_3MgSi_2O_8:Eu^{2+},Mn^{2+}$; $BaAl_8O_{13}:Eu^{2+}$;

$2SrO*0.84P_2O_5*0.16B_2O_3:Eu^{2+}$;

$(Ba,Sr,Ca)MgAl_{10}O_{17}:Eu^{2+},Mn^{2+}$; $(Ba,Sr,Ca)Al_2O_4:Eu^{2+}$;

$(Y,Gd,Lu,Sc,La)BO_3:Ce^{3+},Tb^{3+}$;

$ZnS:Cu^+,Cl^-$; $ZnS:Cu^+,Al_{3+}$; $ZnS:Ag^+,Cl^-$; $ZnS:Ag^+,Al^{3+}$;

$(Ba,Sr,Ca)_2 Si_{1-n}O_{4-2n}:Eu^{2+}$ (wherein $0 \leq n \leq 0.2$);

$(Ba,Sr,Ca)_2(Mg,Zn)Si_2O_7:Eu^{2+}$;

$(Sr,Ca,Ba,Al,Ga,In)_2S_4:Eu^{2+}$;

$(Y,Gd,Tb,La,Sm,Pr,Lu)_3(A,Ga)_{5-a}O_{12-3/2a}:Ce^{3+}$ (wherein $0 \leq a \leq 0.5$);

$(Ca,Sr)_8(Mg,Zn)(SiO_4)_4Cl_2:Eu^{2+},Mn^{2+}$; $Na_2Gd_2B_2O_7:Ce^{3+},Tb^{3+}$; $(Sr,Ca,Ba,Mg,Zn)_2P_2O_7:Eu^{2+},Mn^{2+}$;

$(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$;

$(Ca,Sr)S:Eu^{2+},Ce^{3+}$; $SrY_2S_4:Eu^{2+}$; $CaLa_2S_4:Ce^{3+}$; $(Ba,Sr,Ca)MgP_2O_7:Eu^{2+},Mn^{2+}$;

$(Y,Lu)_2WO_6:Eu^{3+},Mo^{6+}$;

$(Ba,Sr,Ca)_b Si_g N_m:Eu^{2+}$ (wherein $2b+4g=3m$); $Ca_3(SiO_4)Cl_2:Eu^{2+}$;

$(Lu,Sc,Y,Tb)_{2-u-v}Ce_v Ca_{1-u}Li_w Mg_{2-w}P_w(Si,Ge)_{3-w}O_{12-u/2}$ (where $-0.5 \leq u \leq 1$, $0 < v \leq 0.1$, and $0 \leq w \leq 0.2$); $(Y,Lu,Gd)_{2+m}(Y,Lu,Gd)Ca_m Si_4 N_{6+m} C_{1-m}:Ce^{3+}$, (wherein $0 \leq m \leq 0.5$);

$(Lu,Ca,Li,Mg,Y)$, α-SiAlON doped with $Eu^{2+}$ and/or $Ce^{3+}$;

$(Ca,Sr,Ba)SiO_2N_2:Eu^{2+},Ce^{3+}$;

β-SiAlON $Eu^{2+},Ba[Li_2(Al_2Si_2)N_6]:Eu^{2+}$, $3.5MgO*0.5MgF_2*GeO_2:Mn^{4+}$;

$(Ca, Sr)_{1-c-f}Ce_c Eu_f Al_{1+c} Si_{1-c} N_3$, (where $0 \leq c \leq 0.2$, $0 \leq f \leq 0.2$); $Ca_{1-h-r}Ce_h Eu_r Al_{1-h}(Mg,Zn)_h SiN_3$, (where $0 \leq h \leq 0.2$, $0 \leq r \leq 0.2$);

$Ca_{1-2s-t}Ce_s(Li,Na)_s Eu_t AlSiN_3$, (where $0 \leq s \leq 0.2$, $0 \leq t \leq 0.2$, $s+t>0$); $(Sr, Ca)AlSiN_3: Eu^{2+},Ce^{3+}$(CASN);

$(Ba, Sr)_2 Si_5 N_8:Eu^{2+}$; $Sr[LiAl_3N_4]:Eu^{2+}$; and $Sr[Mg_3SiN_4]:Eu^{2+}$.

$U^{6+}$-doped phosphors may also be used; exemplary compositions include $Ba_6Al_5P_5O_{26}$: $U^{6+}$, $Ba_2P_2O$: $U^{6+}$, $BaZn_2(PO_4)_2$: $U^{6+}$, and $BaBPO$: $U^{6+}$. Other $U^{6+}$-doped phosphors are disclosed in US 2019/0088827, U.S. Ser. No. 15/915,341, filed on 8 Mar. 2018, and U.S. Ser. No. 16/124,520, filed on 7 Sep. 2018, all assigned to General Electric Company.

Quantum dot (QD) materials for use in devices according to the present invention may be a group II-VI compound, a group III-V compound, a group IV-IV compound, a group IV compound, a group I-III-VI$_2$ compound or a combination thereof. Examples of group II-VI compounds include CdSe, CdTe, CdS, ZnSe, ZnTe, ZnS, HgTe, HgS, HgSe, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, or combinations thereof. Examples of group III-V compounds include GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GainPAs, InAlNP, InAlNAs, InAlPAs, and combinations thereof. Examples of group IV compounds include Si, Ge, SiC, and SiGe. Examples of group I-III-VI$_2$ chalcopyrite-type compounds include $CuInS_2$, $CuInSe_2$, $CuGaS_2$, $CuGaSe_2$, $AgInS_2$, $AgInSe_2$, $AgGaS_2$, $AgGaSe_2$ and combinations thereof.

The QD materials may be a core/shell QD, including a core, at least one shell coated on the core, and an outer coating including one or more ligands, preferably organic polymeric ligands. Exemplary materials for preparing core-shell QDs include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdSeZn, CdTe, HgS, HgSe, HgTe, BeS, BeSe, BeTe, MgS, MgSe, MnS, MnSe, GeS, GeSe, GeTe, SnS, SnSe, SnTe, PbO, PbS, PbSe, PbTe, CuF, CuCi, CuBr, CuI, $Si_3N_4$, $Ge_3N_4$, $Al_2O_3$, $(Al, Ga, In)_2(S, Se, Te)_3$, $A_{12}CO$, and appropriate combinations of two or more such materials. Exemplary core-shell QDs include, but are not limited to, CdSe/ZnS, CdSe/CdS, CdSe/CdS/ZnS, CdSeZn/CdS/ZnS, CdSeZn/ZnS, InP/ZnS, PbSe/PbS, PbSe/PbS, CdTe/CdS and CdTe/ZnS.

The QD materials typically include ligands conjugated to, coordinated with, associated with, or attached to their surface. In particular, the QDs may include a coating layer comprising ligands to protect the QDs from environmental conditions including elevated temperatures, high intensity light, external gasses, and moisture. Such coating layer can also help to control aggregation, and allow for dispersion of the QDs in the matrix material.

Phosphor composition for use in display or lighting devices may include one or more phosphors that result in a green spectral power distribution under ultraviolet, violet, or blue excitation. In the context of the present invention, this is referred to as a green phosphor or green phosphor material. The green phosphor may be a single composition or a blend that emits light in a green to yellow-green to yellow range, such as cerium-doped yttrium aluminum garnets, more particularly $(Y,Gd,Lu,Tb)_3(Al,Ga)_5O_{12}:Ce^{3+}$ (YAG). In some embodiments, an LED package 10 has a color temperature less than or equal to 4200° K, and the only red phosphor present in phosphor composition 22 is the $Mn^{4+}$ doped phosphor; in particular, $K_2SiF_6:Mn^{4+}$. The composition may additionally include a green phosphor. The green phosphor may be a $Ce^{3+}$-doped garnet or blend of garnets, particularly a $Ce^{3+}$-doped yttrium aluminum garnet, and more particularly, YAG. When the red phosphor is $K_2SiF_6:Mn^{4+}$, the mass ratio of the red phosphor to the green phosphor material may be less than 3.3, which may be significantly lower than for red phosphors of similar composition, but having lower levels of the Mn dopant. Other green-emitting that may be used with the $Mn^{4+}$ doped phosphors include green-emitting QD materials and β-SiAlON.

The ratio of each of the individual phosphors in a phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram, and a white light is preferably produced. This white light may, for instance, possess an x value in the range of about 0.20 to about 0.55, and a y value in the range of about 0.20 to about 0.55. However, the exact identity and amounts of each phosphor in the phosphor composition can be varied according to the needs of the end user. For example, the material can be used for LEDs intended for liquid crystal display (LCD) backlighting. In this application, the LED color point would be appropriately tuned based upon the desired white, red, green, and blue colors after passing through an LCD/color filter combination. The list of potential phosphors for blending given here is not meant to be exhaustive and these $Mn^{4+}$ doped phosphors can be blended with various phosphors with different emission to achieve desired spectral power distributions.

Other materials suitable for use in devices according to the present invention include electroluminescent polymers such as polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly (vinylcarbazole) and polyphenylenevinylene and their derivatives. In addition, the light emitting layer may include a blue, yellow, orange, green or red phosphorescent dye or metal complex, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorephenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

The $Mn^{4+}$ doped phosphors of the present invention may be used in applications other than those described above. For example, the material may be used as a phosphor in a fluorescent lamp, in a cathode ray tube, in a plasma display device or in an LCD, as explained above. The material may also be used as a scintillator in an electromagnetic calorimeter, in a gamma ray camera, in a computed tomography scanner or in a laser. These uses are merely exemplary and not limiting.

The present invention is also directed to certain inventive phosphor compositions. For example, the present invention may be directed to a phosphor composition comprising phosphor particles and comprising, on surfaces of the phosphor particles, at least one surface composition selected from the group consisting of: 1) a composition containing a phosphorus-containing moiety and a carbon-containing moiety; 2) a composition containing a phosphorus-containing moiety and a metal fluoride; 3) a composition containing a phosphorus-containing moiety and a carbon-containing moiety and a metal fluoride; and 4) a composition comprising the phosphorus-containing moiety free of an alkyl phosphate compound, wherein the phosphor particles comprise a $Mn^{4+}$ doped phosphor of formula I which is $A_x[MF_y]:Mn^{4+}$, where A is Li, Na, K, Rb, Cs, or a combination thereof; M is Si, Ge, Sn, Ti, Zr, Al, Ga, In, Sc, Y, La, Nb, Ta, Bi, Gd, or a combination thereof; x is the absolute value of the charge of the $[MF_y]$ ion; y is 5, 6 or 7.

The surface composition containing a phosphorus-containing moiety may be formed by exposing the phosphor particles to $K_2HPO_4$. The surface composition containing a carbon-containing moiety may be formed by exposing the phosphor particles to one or more of polyoxyethylene octyl phenyl ether, potassium oleate, polyoxyethylene-polyoxypropylene block copolymer, polyoxyethylene (20) sorbitan monolaurate, poly(acrylic acid sodium salt), and potassium sorbate. The surface composition containing a phosphorus-containing moiety free of an alkylphosphate may be formed by exposing the phosphor particles to $K_2HPO_4$.

In one such composition, in an embodiment, the metal fluoride comprises magnesium fluoride. In another embodiment, the compound containing phosphorus comprises a phosphate moiety; in the context of the present invention, 'phosphate' means an ion that contains $PO_4$, and includes the phosphate ion, $PO_{43}$ hydrogen phosphate ion, $HPO_{42}$, and dihydrogen phosphate ion, $H_2PO_4^-$. In yet another embodiment, the compound containing carbon comprises at least one selected from the group consisting of: ethylenediaminetetraacetic acid, polyoxyethylene octyl phenyl ether, potassium oleate, polyoxyethylene-polyoxypropylene block copolymer, polyoxyethylene (20) sorbitan monolaurate, poly(acrylic acid sodium salt), potassium sorbate, and derivatives or salts thereof.

The surface composition improves the quantum efficiency of the phosphor particles upon exposure to liquid water or water vapor. In an embodiment, the phosphor particles exhibit A) a quantum efficiency after exposure to liquid water for one hour at room temperature that is 50% to 100% of the quantum efficiency exhibited before water exposure or B) a quantum efficiency loss upon exposure to 85% relative humidity at 85 deg C. for 100 hours that is less than 40%.

An advantage of the present invention is that the phosphor particles are less agglomerated than would otherwise be the case. In an embodiment, a $D_{50}$ particle size of the phosphor particles before sonication of a solution containing the particles is no greater than 30 μm and the $D_{50}$ particle size of the phosphor particles after sonication is no greater than 20 μm. In other words, the phosphor particles are sufficiently not agglomerated that the use of sonication will result in less of a decrease in agglomeration than would occur with particles which are not treated pursuant to the present invention. Phosphor powders containing substantially unagglomerated particles may show improved flowability and dispersibility during LED package fabrication.

A light emitting diode device is a structure which contains a light emitting diode. In an embodiment, a light emitting diode device is radiationally coupled to and/or comprises the phosphor composition according to the present invention. In another embodiment, the light emitting diode device is a mini LED or a micro LED. In yet another embodiment, a light emitting diode device can comprise an LED chip on which the phosphor composition is deposited. The phosphor composition is optionally dispersed in a polymeric resin in a form of a film.

EXAMPLES

In the Examples mentioned below, the primary particle size was measured using a scanning electron microscope with procedures that are known in the art, and the secondary particle size was measured using a Horiba LA-950V2 Laser Scattering Particle Size Distribution Analyzer, also with procedures which are known in the art. Primary particle size according to the present application is the particle size of each phosphor particle, whether in agglomerated state or not. The secondary particle size according to the present application is the particle size of each discreet particle or unit of particles. For example, if two 10 μm phosphor particles are agglomerated with one another, the primary particle size would be 10 μm since that is the size of each of the basic phosphor particles. In this scenario, the secondary particle size would be more than 10 μm. For example, it may be 20 μm due to the agglomeration.

Span is a measure of the width of the particle size distribution curve for a particulate material or powder, and is defined according to equation (1):

$$\text{Span} = \frac{(D_{90} - D_{10})}{D_{50}} \qquad (1)$$

wherein
$D_{50}$ is the median particle size for a volume distribution;
$D_{90}$ is the particle size for a volume distribution that is greater than the particle size of 90% of the particles of the distribution; and
$D_{10}$ is the particle size for a volume distribution that is greater than the particle size of 10% of the particles of the distribution.

Quantum efficiency (QE) measurement is known in the art and can be done, for example, with a spectrometer. QE is a measure of blue photons absorbed/red photons emitted from luminescence of the phosphor. If there is 100% QE, this means that every blue photon which is absorbed results in the emission of a red photon. QE is measured relative to a reference sample so in the present application, when QE's are compared, those are the QEs relative to a reference sample. It is not critical which reference sample is utilized since the comparison is of two or more other samples relative to the reference sample so that the other two or more samples can be compared to one another.

Determination of Robustness Against Contact with Water

Example 1

This example is directed to a phosphor having chemical formula $K_2SiF_6:Mn^{4+}$. This phosphor powder had an average primary particle size of 10.5 μm as determined by scanning electron microscopy. This phosphor was not stabilized as described in the present application nor exposed to a water test.

Example 2

1 g of the phosphor of Example 1 was mixed with 3 g deionized water in a 15 mL plastic bottle. The mixture was shaken by hand for 15 seconds and then rolled at 40 rpm for 1 hour. The mixture was filtered on Whatman #4 filter paper and washed 4 times with a total of 100 mL acetone (i.e., 100 mL of acetone was used to effectuate the 4 washes). The powder was dried under vacuum for at least 24 hours.

Example 3

1.2 g of the phosphor of Example 1 was mixed with 3.6 g of a 39 mM solution of phosphoric acid in a 15 mL plastic bottle. The mixture was shaken by hand for 15 seconds and then rolled at 40 rpm for 1 hour. The mixture was filtered on Whatman #4 filter paper and washed 4 times with a total of 100 mL acetone. The powder was dried under vacuum for at least 18 hours. The powder was added to a fresh bottle and mixed with deionized water in a 1 g:3 g ratio of powder to water. The mixture was shaken by hand for 15 seconds and then rolled at 40 rpm for 1 hour. The mixture was filtered on Whatman #4 filter paper and washed 4 times with a total of 100 mL acetone. The powder was dried under vacuum for at least 24 hours.

Example 4

The experiment of Example 3 was repeated, replacing 39 mM phosphoric acid with 390 mM phosphoric acid.

Example 5

The experiment of Example 3 was repeated, replacing 39 mM phosphoric acid with 39 mM oxalic acid.

Example 6

The experiment of Example 3 was repeated, replacing 39 mM phosphoric acid with 390 mM oxalic acid.

Example 7

The experiment of Example 3 was repeated, replacing 39 mM phosphoric acid with 39 mM potassium hydrogen phosphate, dibasic.

Example 8

The experiment of Example 3 was repeated, replacing 39 mM phosphoric acid with 390 mM potassium hydrogen phosphate, dibasic (pH 9).

Cured films of a 2-part thermally cured polydimethylsiloxane elastomer (such as is sold as Sylgard 184, from Dow Corning) comprising dispersed phosphor particles were prepared at a concentration of 0.5 g of phosphor per 1.5 g of silicone. The phosphors used were the ones prepared in Examples 1-8. The quantum efficiencies (QE) of the phosphor particles were measured in these films.

The results of QE measurements on phosphor containing films are summarized in Table 1 for Examples 1-8.

TABLE 1

Measured QE values for the phosphor containing films of Examples 1-8.

| Example | Details | QE |
|---|---|---|
| 1 | Starting material $K_2SiF_6:Mn^{4+}$ | 105.6% |
| 2 | Control - starting $K_2SiF_6:Mn^{4+}$ (from Example 1 mixed with water | 74.6% |
| 3 | $K_2SiF_6:Mn^{4+}$ from Example 1 mixed with 39 mM $H_3PO_4$ then water | 86.2% |
| 4 | $K_2SiF_6:Mn^{4+}$ from Example 1 mixed with 390 mM $H_3PO_4$ then water | 90.3% |
| 5 | $K_2SiF_6:Mn^{4+}$ from Example 1 mixed with 39 mM oxalic acid then water | 80.1% |
| 6 | $K_2SiF_6:Mn^{4+}$ from Example 1 mixed with 390 mM oxalic acid then water | 85.3% |
| 7 | $K_2SiF_6:Mn^{4+}$ from Example 1 mixed with 39 mM $K_2HPO_4$ then water | 100.7% |
| 8 | $K_2SiF_6:Mn^{4+}$ from Example 1 mixed with 390 mM $K_2HPO_4$ then water | 104.2% |

The data in Table 1 shows that the robustness of $K_2SiF_6:Mn^{4+}$ phosphor is enhanced by a process comprising mixing $K_2SiF_6:Mn^{4+}$ with an aqueous solution of several substances, such as $K_2HPO_4$, followed by powder isolation and drying. Enhanced robustness is shown as a preservation of QE after mixing the treated phosphor powder with water for 1 hour, vs the QE of the untreated powder as produced mixed with water for 1 hour, relative to the QE of the starting phosphor powder without mixing with water. The QE of Example 1 is 105.6%, which is not treated with water. The QE of Example 2 is 74.6%, which shows that water can have a large detrimental effect on the QE of phosphors. Example 2 is not treated in accordance with the present invention. Example 3 is treated in accordance with the present invention and exhibits a QE of 86.2%, which is much higher than a QE of 74.6%. In the technology for phosphors, even a small percentage change in QE is significant and phosphor manufacturers are routinely looking for ways to add even a few percentage points of QE to their phosphors. Thus, a jump from 74.6% to 86.2% is significant and surprising. Of the Examples above, the effect of treating the phosphor powder with an aqueous solution of $K_2HPO_4$ was most pronounced in maintaining QE, since Examples 7 and 8 show a QE of 100.7% and 104.2%, respectively.

Example 9

This Example is directed to a phosphor having chemical formula $K_2SiF_6:Mn^{4+}$. This phosphor was not stabilized as described in the present application nor exposed to a water test. The $K_2SiF_6:Mn^{4+}$ phosphor of Example 9 had an average primary particle size of 10.0 μm as determined by scanning electron microscopy. Furthermore, the phosphor of Example 9 was not treated with an HF solution of $K_2SiF_6$ after annealing.

Example 10

The phosphor used in Example 10 is the same as in Example 1, and both are treated with an HF solution saturated with $K_2SiF_6$ after annealing. The Examples are duplicates of one another. The fact that they get similar results for QE means that this experiment is repeatable.

Example 11

A $K_2SiF_6:Mn^{4+}$ phosphor was utilized which has a smaller average primary particle size as Examples 1 and 9.

The phosphor powder of Example 11 had an average primary particle size of 3.9 μm as determined by scanning electron microscopy and did not receive stabilizing treatment according to the present invention.

Example 12

A $K_2SiF_6:Mn^{4+}$ phosphor was utilized which has a smaller average particle size than Examples 1 and 9. The phosphor of Example 12 had an average primary particle size of 3.9 μm as determined by scanning electron microscopy and did not receive stabilizing treatment according to the present invention.

Examples 13-16

In four separate experiments, 1 g of each of the phosphor samples from Example 9, Example 1, Example 11, and Example 12, respectively, was mixed with 3 g deionized water in a 15 mL plastic bottle. The mixtures were shaken by hand for 15 seconds and then rolled at 40 rpm for 1 hour. The mixtures were filtered on Whatman #4 filter paper and each washed 4 times with a total of 100 mL acetone. The powders were dried under vacuum for at least 24 hours.

Examples 17-20

In four separate experiments, 1.2 g of each of the phosphor samples from Example 9, Example 1, Example 11, and Example 12, respectively, was mixed with 3.6 g of a 390 mM solution of potassium hydrogen phosphate, dibasic (pH 9), in a 15 mL plastic bottle. The mixtures were shaken by hand for 15 seconds and then rolled at 40 rpm for 1 hour. The mixtures were filtered on Whatman #4 filter paper and each washed 4 times with a total of 100 mL acetone. The powders were dried under vacuum for at least 18 hours. The powders were then added to a fresh bottle and mixed with deionized water in a 1 g:3 g ratio of powder to deionized water. The mixtures were shaken by hand for 15 seconds and then rolled at 40 rpm for 1 hour. The mixtures were filtered on Whatman #4 filter paper and each washed 4 times with a total of 100 mL acetone. The powders were dried under vacuum for at least 24 hours.

Example 21

1.2 g of the phosphor sample of Example 1 was mixed with 3.6 g of a 390 mM solution of potassium hydrogen phosphate, dibasic (pH 9), in a 15 mL plastic bottle. The mixture was shaken by hand for 15 seconds and then rolled at 40 rpm for 15 minutes. The mixture was filtered on Whatman #4 filter paper and then washed 4 times with a total of 100 mL acetone. The powder was dried under vacuum for 4 hours. The powder was then added to a fresh bottle and mixed with deionized water in a 1 g:3 g ratio of powder to deionized water. The mixture was shaken by hand for 15 seconds and then rolled at 40 rpm for 1 hour. The mixture was filtered on Whatman #4 filter paper and then washed 4 times with a total of 100 mL acetone. The powder was dried under vacuum for at least 24 hours.

Example 22

The experiment of Example 21 was repeated except that the aqueous 390 mM $K_2HPO_4$ solution mixed with the phosphor of Example 1 was rolled for 90 minutes instead of 15 minutes.

Example 23

1.2 g of phosphor from Example 1 was mixed with 3.6 g of a 390 mM solution of potassium hydroxide (pH 13.5) in a 15 mL plastic bottle. The mixture was shaken by hand for 15 seconds and then rolled at 40 rpm for 1 hour. The mixture was filtered on Whatman #4 filter paper and then washed 4 times with a total of 100 mL acetone. The powder was dried under vacuum for 4 hours. The powder was then added to a fresh bottle and mixed with deionized water in a 1 g:3 g ratio of powder to ionized water. The mixture was shaken by hand for 15 seconds and then rolled at 40 rpm for 1 hour. The mixture was filtered on Whatman #4 filter paper and then washed 4 times with a total of 100 mL acetone. The powder was dried under vacuum for at least 24 hours.

Example 24

The experiment of Example 23 was repeated except that the 390 mM solution of KOH was replaced with a more dilute aqueous KOH solution adjusted to pH 9.

TABLE 2

Measured QE values for the phosphor containing films of Examples 9-24.

| Description | Ex | Details | QE |
|---|---|---|---|
| Starting material (SM) | 9 | Starting material $K_2SiF_6:Mn^{4+}$ of Example 9 | 104.9% |
| | 10 | Starting material $K_2SiF_6:Mn^{4+}$ of Example 1 | 104.8% |
| | 11 | Starting material $K_2SiF_6:Mn^{4+}$ of Example 11 | 97.6% |
| | 12 | Starting material $K_2SiF_6:Mn^{4+}$ of Example 12 | 98.5% |
| Control samples: SM's mixed with water | 13 | $K_2SiF_6:Mn^{4+}$ of Example 9 mixed with water | 62.7% |
| | 14 | $K_2SiF_6:Mn^{4+}$ of Example 1 mixed with water | 73.7% |
| | 15 | $K_2SiF_6:Mn^{4+}$ of Example 11 mixed with water | 25.0% |
| | 16 | $K_2SiF_6:Mn^{4+}$ of Example 12 mixed with water | 25.1% |
| Effect of mixing SM with aq $K_2HPO_4$ before mixing with water | 17 | $K_2SiF_6:Mn^{4+}$ of Example 9 mixed with 390 mM $K_2HPO_4$ 1 h, then water | 104.3% |
| | 18 | $K_2SiF_6:Mn^{4+}$ of Example 1 mixed with 390 mM $K_2HPO_4$ 1 h, then water | 104.5% |
| | 19 | $K_2SiF_6:Mn^{4+}$ of Example 11 mixed with 390 mM $K_2HPO_4$ 1 h, then water | 91.9% |
| | 20 | $K_2SiF_6:Mn^{4+}$ of Example 12 mixed with 390 mM $K_2HPO_4$ 1 h, then water | 93.5% |
| Effect of aq $K_2HPO_4$ mixing time | 21 | $K_2SiF_6:Mn^{4+}$ of Example 1 mixed with 390 mM $K_2HPO_4$ 15 min, then water | 104.4% |
| | 22 | $K_2SiF_6:Mn^{4+}$ of Example 1 mixed with 390 mM $K_2HPO_4$ 1.5 h, then water | 104.9% |
| Effect of mixing with aq KOH | 23 | $K_2SiF_6:Mn^{4+}$ of Example 1 mixed with 390 mM KOH 1 h, then water | 75.6% |
| | 24 | $K_2SiF_6:Mn^{4+}$ of Example 1 mixed with pH 9 KOH 1 h, then water | 51.0% |

The data shown in Table 2 confirms that mixing $K_2SiF_6:Mn^{4+}$ phosphor powder with water has a significant detrimental effect on the phosphor's QE. Examples 17 and 18 clearly show that when the phosphor powder is mixed with an aqueous solution of $K_2HPO_4$ prior to mixing with pure water, the phosphor powder is rendered surprisingly more robust against degradation upon subsequent exposure to water. Degradation is indicated by a drop in QE, and samples 13-16, without $K_2HPO_4$ exposure, showed much lower QE than Examples 17-20 which were treated with $K_2HPO_4$. Moreover, without intending to be bound by any theory, this measure of stability or robustness is durable in the sense that the benefit persists even after isolation of the powder from the aqueous $K_2HPO_4$ treatment solution, washing and drying. The data shows that the stabilization of the powder is surprisingly fast since the QE of powder mixed with aqueous $K_2HPO_4$ for just 15 minutes was essentially the same as when the mixing time was 1 hour or even 90 minutes. In Examples 18, 21 and 22, 15 minutes of exposure to aqueous $K_2HPO_4$ resulted in a QE that was just as high as the QE after 90 minutes exposure. The phosphor powder is substantially stable in the $K_2HPO_4$ treatment solution over extended time periods in spite of the fact that the aqueous $K_2HPO_4$ is mostly water which is known to degrade phosphors.

Examples 11, 12, 15 and 16 are untreated with $K_2HPO_4$ and include samples of small particle sizes. Examples 19 and 20 are both treated with $K_2HPO_4$ and include samples with small particle sizes. The results for Examples 19 and 20 show that the stabilization resulting from treatment of the phosphor powder with aqueous $K_2HPO_4$ is surprisingly high even when the $K_2SiF_6$:$Mn^{4+}$ powder has a primary particle size of 3.9 μm.

The surprising stabilization afforded upon treatment of the phosphor with aqueous $K_2HPO_4$ is not just a pH effect. As shown in Example 24, mixing phosphor powder with an aqueous solution of KOH that was pH-adjusted to match the pH of 390 mM $K_2HPO_4$ (see Examples 17-20) did not result in phosphor stabilization. In fact, the QE of Example 24 was just 51%, which is even lower than Example 14 (which was acidic with a pH of 3.28) which had a QE of 73.7% and which was not mixed with a stabilization agent. In other words, adjusting the pH with KOH to be basic (Example 24) resulted in a much worse result than adding no stabilization agent (Example 14). A significant QE drop was also observed in Example 23 (QE of 75.6%) when the phosphor powder was mixed with aqueous KOH (pH 13.48) that matched the concentration of the $K_2HPO_4$ solutions (390 mM) in Examples 17-22 where the lowest QE was 91.9%.

Reduction of Agglomeration

In order to reduce the agglomeration of phosphor particles, several treatments were tested. The objective is to reduce agglomeration so that dispersibility in resins is improved, such that if the phosphor powders are dispersed in, say, films of photoresist or hydrophobic acrylates, the phosphors are uniformly distributed. Various combinations of solvents and surfactants were used. Typical solvents ranged from non-polar hydrocarbon solvents such as 1-octadecene (ODE) to moderately polar isonorbornyl acrylate to polar aprotic propylene glycol monomethyl ether acetate (PGMEA). Surfactant/dispersant additives included those that are non-ionic (oleylamine, oleic acid, polyoxyethylene octyl phenyl ether (which may be sold as Triton X-100)), anionic (potassium oleate) and cationic (polyethylene oxide derivatized fatty ammonium ethosulphate (which may be marketed as Hypermer KD25-LQ-(MV)). Examples 25-71 had secondary particle size d50 measured using light scattering.

Example 25

Example 25 is a control and consisted of 3 g of $K_2SiF_6$:$Mn^{4+}$ powder having a secondary particle size d50 of 15.0 μm. No solvent or surfactant/dispersant was added. This control was used to determine the values of the second column of Table 3 (Δd50–ODE+roller (μm)).

Example 26

Example 26 had organic solvent and no surfactant, and was made by taking 3 g of $K_2SiF_6$:$Mn^{4+}$ powder from the same lot as Example 25 and mixing it with 20 mL of ODE which is an organic solvent. Then, the resulting composition was shaken briefly to mix and rolled at 80 rpm for 20-30 minutes. The resulting mixture was then vacuum filtered to collect the powder and rinsed with 3×20 mL of acetone to remove traces of solvent. Following the acetone wash the powder was dried on the filter for no more than five minutes before being collected and dried in a vacuum desiccator for at least 4 hours. The dry powders were then sieved through a 170 mesh screen to improve flowability and then stored in a nitrogen purged box/cabinet until they could be analyzed for particle size distribution (PSD) and quantum efficiency (QE). The secondary particle size d50 was then compared with that measured for Example 25 and the difference or "delta" was recorded in the second column of Table 3. The Δd50 was –1.4 μm, so the d50 of Example 26 was 1.4 μm less than the d50 of Example 25. Thus, the use of ODE as solvent reduced the secondary particle size of the sample.

Examples 27-31

Examples 27-31 were made by taking 20 mL of ODE and combining it with 0.3 g of a respective surfactant as identified on the first column of Table 3, and then adding 3 g of $K_2SiF_6$:$Mn^{4+}$ powder from the same lot as Example 25. Then, the resulting composition was shaken briefly to mix and rolled at 80 rpm for 20-30 minutes. The resulting mixture was then vacuum filtered to collect the powder and rinsed with 3×20 mL of acetone to remove traces of solvent. Following the acetone wash the powder was dried on the filter for no more than five minutes before being collected and dried in a vacuum desiccator for at least 4 hours. The dry powders were then sieved through a 170 mesh screen to improve flowability and then stored in a nitrogen purged box/cabinet until they could be analyzed for secondary particle size and QE. The secondary particle size d50s were then compared with Example 25 and the difference for each, or "delta" was recorded at the second column of Table 3.

Example 32

Example 32 is a control and consists of 3 g of $K_2SiF_6$:$Mn^{4+}$ powder having a secondary particle size d50 of 33.4 μm. No solvent or surfactant/dispersant was added. The QE of Example 32 was 92.8%. This control was used to determine the values of the third column of Table 3 (Δd50–PGMEA+roller (μm)).

Example 33

Example 33 has organic solvent and no surfactant, and was made by taking 3 g of $K_2SiF_6$:$Mn^{4+}$ powder from the same lot as Example 32 and mixing it with 20 mL of propylene glycol monomethyl ether acetate (PGMEA) which is an organic solvent. Then, the resulting composition was shaken briefly to mix and rolled at 80 rpm for 20-30 minutes. The resulting mixture was then vacuum filtered to collect the powder and rinsed with 3×20 mL of acetone to remove traces of solvent. Following the acetone wash the powder was dried on the filter for no more than five minutes before being collected and dried in a vacuum desiccator for at least 4 hours. The dry powder was then sieved through a 170 mesh screen to improve flowability and then stored in a nitrogen purged box/cabinet until it could be analyzed for PSD and QE. The secondary particle size distribution d50 was then compared with Example 32 and the difference or "delta" was recorded in Table 3, so Δd50 was −18.6 μm so the d50 of Example 33 was 18.6 μm less than the d50 of Example 32.

Examples 34-38

Examples 34-38 were made by taking 20 mL of PGMEA and combining it with 0.3 g of a particular surfactant as identified at column 1 of Table 3 and then adding 3 g of $K_2SiF_6$:$Mn^{4+}$ powder from the same lot as Example 32. Then, the resulting composition was shaken briefly to mix and rolled at 80 rpm for 20-30 minutes. The resulting mixture was then vacuum filtered to collect the powder and rinsed with 3×20 mL of acetone to remove traces of solvent. Following the acetone wash the powder was dried on the filter for no more than five minutes before being collected and dried in a vacuum desiccator for at least 4 hours. The dry powders were then sieved through a 170 mesh screen to improve flowability and then stored in a nitrogen purged box/cabinet until they could be analyzed for PSD and QE. The particle size d50 was then compared with Example 32 and the differences or "deltas" was recorded in Table 3 at column 3.

Example 39

Example 39 is a control and consists of 3 g of $K_2SiF_6$:$Mn^{4+}$ powder having a secondary particle size d50 of 35.2 μm. No solvent or surfactant/dispersant was added. The QE for this sample was determined to be 94.1%. Example 39 is the control used in conjunction with columns 4-6 of Table 3 (Δd50−PGMEA+ultrasound (μm); Δd50−acrylate+roller (μm); Δd50−acrylate+ultrasound (μm), respectively).

Example 40

Example 40 had organic solvent and no surfactant, and was made by taking 3 g of $K_2SiF_6$:$Mn^{4+}$ powder from the same lot as Example 39 and mixing it with 20 mL of isonorbornyl acrylate which is an organic solvent. Then, the resulting composition was shaken briefly to mix and rolled at 80 rpm for 20-30 minutes. The resulting mixture was then vacuum filtered to collect the powder and rinsed with 3×20 mL of acetone to remove traces of solvent. Following the acetone wash the powder was dried on the filter for no more than five minutes before being collected and dried in a vacuum desiccator for at least 4 hours. The dry powders were then sieved through a 170 mesh screen to improve flowability and then stored in a nitrogen purged box/cabinet until they could be analyzed for secondary PSD and QE. The secondary particle size d50 was then compared with Example 39 and the difference or "delta" was recorded at column 5 of Table 3, so Δd50 was −19.4 μm so the d50 of Example 40 was 19.4 um less than the d50 of Example 39.

Examples 41-47

Examples 41-47 were made by taking 20 mL of PGMEA (for Examples 41-43) or 20 mL of isonorbornyl acrylate (Examples 44-47) and combining each with 0.3 g of a surfactant identified at the last three lines of column 1 of Table 3. Subsequently, 3 g of $K_2SiF_6$:$Mn^{4+}$ powder from the same lot as Example 39 was added. Then, the resulting composition was shaken briefly to mix and subjected to either an ultrasonic bath treatment for 7 minutes (Examples 41-43 and 47) or rolled at 80 rpm for 20-30 minutes (Examples 44-46). The resulting mixtures were then vacuum filtered to collect the powder and rinsed with 3×20 mL of acetone to remove traces of solvent. Following the acetone wash the powder was dried on the filter for no more than five minutes before being collected and dried in a vacuum desiccator for at least 4 hours. The dry powders were then sieved through a 170 mesh screen to improve flowability and then stored in a nitrogen purged box/cabinet until they could be analyzed for secondary PSD and QE. The secondary particle size d50 was then compared with Example 39 and the difference or "delta" was recorded in Table 3. Examples 41-43 are recorded at column 4 (Δd50−PGMEA+ultrasound (μm)), Examples 44-46 are recorded at column 5 (Δd50−acrylate+roller (μm)), and Example 47 is recorded at column 6 (Δd50−acrylate+ultrasound (μm)) of Table 3. The absolute secondary particle size d50 (i.e., not relative to Example 39) of sample 41 is 12.9 μm and the QE was 88.4%. The absolute secondary particle size d50 (i.e., not relative to Example 39) of sample 42 was 12.0 μm and the QE is 94.3%. The absolute secondary particle size d50 (i.e., not relative to Example 39) d50 of sample 43 was 12.5 μm and the QE was 94.2%.

TABLE 3

Particle size distribution reduction without sonication during measurement upon surfactant/dispersant treatment of $K_2SiF_6$:$Mn^{4+}$ powders.

| Surfactant | Δd50 − ODE + roller (μm) | Δd50 − PGMEA + roller (μm) | Δd50 − PGMEA + ultrasound (μm) | Δd50 − acrylate + roller (μm) | Δd50 − acrylate + ultrasound (μm) |
|---|---|---|---|---|---|
| None | −1.4 | −18.6 | | −19.4 | |
| Oleic acid | +9.7 (asym) | −13.9 | | | |
| Oleylamine | +6.6 (asym) | −18.5 | | | |
| Potassium oleate | −0.1 | −20.3 | −22.3 | −21.2 | −22.7 |
| polyoxy-ethylene octyl phenyl ether | +4.4 | −19.4 | −23.2 | −21.0 | |
| PODFAE | −3.2 | −18.9 | −22.7 | −19.2 | |

As can be seen in Table 3, the use of certain solvents can help reduce agglomeration. The use of certain surfactants can also reduce agglomeration. Certain combinations of solvents and surfactants exhibit advantages as well. Regardless of the extent of agglomeration in the initial powder, the potassium oleate, polyoxyethylene octyl phenyl ether, and polyethylene oxide derivatized fatty ammonium ethosulphate (PODFAE) such as may be obtained as Hypermer KD25-LQ-(MV), as the leading anionic, non-ionic, and cationic additive candidates, respectively, resulted in a secondary particle size with absolute secondary d50 of 12-14 μm (i.e., not relative to another sample). The comparison to the controls is shown in Table 3.

Variants of the examples shown above also demonstrate the advantages of the present invention. Examples 48-51 below exemplify this and the results are in Table 4.

Example 48

This is a control which is $K_2SiF_6:Mn^{4+}$ without any surface treatment. In other words, no KEDTA nor $K_2HPO_4$, nor potassium oleate, nor PGMEA, nor $MgF_2$ coated phosphor, nor $MgSiF_6 \cdot 6H_2O$, nor $H_2SiF_6$.

Example 49

This sample is directed to treatment of $K_2SiF_6:Mn^{4+}$ with ethylenediaminetetraacetic acid dipotassium salt dihydrate (KEDTA). A solution was prepared by adding 16.3 g $K_2HPO_4$, 6.4 g KEDTA, 22 mL aqueous 30% $H_2O_2$, and 480 mL distilled $H_2O$ to a 1 L polypropylene bottle such that the pH was between 7-8. To that, 128 g $K_2SiF_6:Mn^{4+}$ was added and the bottle was rolled at 40 RPM for 20 minutes. The material was then allowed to settle, the supernatant decanted and the slurry was vacuum filtered, rinsed once with 100 mL of $H_2O+2$ mL 30% $H_2O_2$, and then 5 times with 100 mL of acetone before drying under vacuum.

It is also possible to optionally rinse the samples with acetic acid and ethanol, and to dry the samples under vacuum at elevated temperature up to 200° C. It is also possible to optionally use ultrasonication in place of/in combination with rolling the bottle.

Example 50

This sample is directed to $K_2SiF_6:Mn^{4+}$ treatment with potassium oleate in organic media. Potassium oleate (7.5229 g, 23.47 mmol, 40 wt % paste in water from Sigma Aldrich, 5 wt % relative to $K_2SiF_6:Mn^{4+}$) was dissolved in 250 mL PGMEA. This solution was added to a 1 gallon plastic bottle containing 150.14 g $K_2SiF_6:Mn^{4+}$ powder and 250 mL of PGMEA. Three additional 250 mL portions PGMEA were used to rinse the potassium oleate container and added to the one gallon bottle containing the $K_2SiF_6:Mn^{4+}$/surfactant mixture (total PGMEA=1.25 L). The one gallon bottle was capped and rolled for 30 minutes. The resulting stabilized phosphor powder was transferred to a plastic Buchner funnel and isolated by vacuum filtration. 500 mL of acetone was used to rinse the one gallon plastic bottle and was transferred to the Buchner funnel to wash the solid. Three additional 500 mL portions of acetone were used to wash the solid, churning the solid before each wash (total 2 L acetone), which was then air dried for 3 minutes. The slightly wet powder was collected and dried for three days in a vacuum desiccator and then sifted through a 170 mesh membrane to afford 146.77 g of surfactant treated $K_2SiF_6:Mn^{4+}$ product.

Example 51

This sample is directed to $MgF_2$ coated phosphor. $MgSiF_6 \cdot 6H_2O$ (17.6992 g, 64.48 mmol) was weighed into a 60 mL plastic jar to which was then added 40 g of high purity deionized water. After mixing, the slightly cloudy mixture was filtered through a 0.45 μm membrane. The filtered solution was diluted with 40 mL of 35% aq $H_2SiF_6$ (52.8 g, density 1.32). This made solution A. Separately, 125 g of $K_2SiF_6:Mn^{4+}$ was added to a 2 L mL plastic beaker containing a large stir bar. Each of two syringe pumps were set up to deliver 37.5 mL of solution A over 30 minutes (75 mL of solution A total) directly into the reaction mixture. To the beaker containing the phosphor powder was added 1.425 L of aq 49% HF saturated with $K_2SiF_6$. The mixture was stirred vigorously for 30 sec (300 rpm) after which the stirring was turned down to 120 rpm. The addition of the solution A into the stirring reaction mixture via syringe pump was initiated. After the addition was complete, the stirring was stopped, the stir bar was removed and the reaction mixture was allowed to settle for 10 minutes. The supernatant was decanted and discarded. The wet slurry was mixed with 400 mL of 49% aq HF saturated with $K_2SiF_6$ and $MgF_2$. The wash mixture was allowed to settle for 10 minutes and then the supernatant was decanted and discarded. The slurry was transferred to a plastic Buchner funnel fitted with a 0.65 μm fluoropolymer membrane. The residual HF solution was filtered off and the phosphor cake was washed with acetone 4 times, using a total of 800 mL acetone, churning the solid before each wash. The product was dried under vacuum for 3 days and then sifted through a 170 mesh membrane to afford the final product. The results of the testing of Examples 48-51 are shown at Table 4.

TABLE 4

| Example | D50 (μm) | D50 US (μm) | Rel QE, % |
|---|---|---|---|
| 48 (Control) | 26 | 14 | 105 |
| 49 | 20 | 11 | 106 |
| 50 | 14 | 11 | 105 |
| 51 | 19 | 14 | 104 |

The D50 secondary particle size of samples 48-51 were measured as follows:

1. D50 measurements in Table 4. Completed on an Horiba 950 with no sonication but circulation set to 5 for 3 minutes prior to measurement. Solvent is isopropyl alcohol.
2. D50 US measurements in Table 4. Completed like measurement above but with a ultrasonication set to 7 in addition to the circulation set to 5.

The Horiba measurement gives an agglomerated size, which is the size of the agglomerated masses of basic particles. The US measurement gives a minimally agglomerated size, which means that it is the agglomerated masses of basic particles decreased somewhat by the ultrasonication.

The examples 48-51 show that the surface treatments and $MgF_2$ coating surprisingly produce a less agglomerated particle size with little to no drop in quantum efficiency.

Examples 52-76 also show the concomitant maintenance of a good quantum efficiency with a reduction of agglomeration of particles, as explained below.

Example 52

This is a batch of $K_2SiF_6:Mn^{4+}$ which was used in all of Examples 53-76.

Example 53

This is the control batch. 4 g $K_2SiF_6:Mn^{4+}$ from Example 52 was put in 20 mL $H_2O$ in a 30 mL Nalgene bottle. It was rolled for 30 minutes at 80 RPM. The sample was then settled for 20 minutes, subjected to a centrifuge pulse to 2500 RPM (~30 sec), then decanted, vacuum filtered, washed with acetone 3 times, vacuum dried, and sifted through a 170 mesh membrane. Example 53 does not contain the surface agents of the present invention and is being compared to samples with surface agents.

Examples 54-76

Examples 54-76 were made as follows: 4 g $K_2SiF_6:Mn^{4+}$ from Example 52 was put in 20 mL $H_2O$ or 20 mL 0.78M $K_2HPO_4$ (aq)+0.3 g or 0.6 g (or 0.3 mL) of surface agent in a 30 mL Nalgene bottle. The bottle was rolled for 30 minutes at 80 RPM. The sample was then settled for 20 minutes, subjected to a centrifuge pulse to 2500 RPM (~30 sec), then decanted, vacuum filtered, washed with acetone 3 times, vacuum dried, and sifted through 170 mesh. The information on the particulars of each Example is found in Table 5 below. The ammonium polyacrylate polymer in Examples 73 and 74 may be sold as Dispex AA 4040.

Table 5 below shows at column 1, the "Example" number, at column 2, the surfactant or other "Surface Agent" that was used. At column 3, whether or not $K_2HPO_4$ was used (this column is labeled as "0.78M $K_2HPO_4$". If that column says Y, then 20 mL of 0.78M of $K_2HPO_4$ was used, if it says N, then just 20 mL of water was used. Column 3 may also indicate other additives which are added along with the $K_2HPO_4$ or water, such as adding 1 mL of 30% aqueous solution of $H_2O_2$. At column 4, which is labeled as "Amount", lists whether the amount of "Surface Agent" used is 0.3 grams or 0.3 mL. At column 5, the QE is shown. At column 6 is shown ΔQE, which is the difference in QE between samples that included $K_2HPO_4$ and those that did not.

As shown above at column ΔQE, the average QE improvement by the use of $K_2HPO_4$ was surprisingly 24.2%. Another observation is that $H_2O_2$ increased QE by >25% as shown for Example 58. Moreover, many of the surface agents also increased QE by a significant amount, as shown in Table 5.

Examples 77-86

For examples 77-84, 3.5 g of $K_2SiF_6:Mn^{4+}$ was added to a solution containing the surface agent listed at Table 6 in 15 mL of 0.39M $K_2HPO_4$(aq). The surface agent was provided in the amount listed in Table 6 as well. The samples were roll milled for 30 minutes. The material was then allowed to settle, the supernatant decanted and the slurry was vacuum filtered, rinsed once with 30 mL of $H_2O$+2 mL 30% $H_2O_2$, and then 5 times with 40 mL of acetone before drying under vacuum. The dried samples were then sieved through a 120 mesh nylon screen. Example 86 is the mother batch used for examples 77-85 and was not subject to water treatment. Example 85 was subject to water treatment but not to a surface agent. The results of the testing are shown at Table 6 with the first column giving the number of the Example, the second column identifying the surface agent used, the third column quantifying the amount of surface agent ("SA") used, and the fourth column providing the QE of such sample. As Table 6 demonstrates, the effect of water

TABLE 5

| Example | Surface Agent | 0.78M $K_2HPO_4$ | Amount | QE | ΔQE |
|---|---|---|---|---|---|
| 54 | | | | 97.6% | |
| 55 | | | | 19.8% | |
| 56 | polyoxyethylene-polyoxypropylene block copolymer | Y | 0.3 grams | 64.4 | |
| 57 | polyoxyethylene-polyoxypropylene block copolymer | N | 0.3 grams | 26.9 | 37.5 |
| 58 | polyoxyethylene-polyoxypropylene block copolymer | Y + 1 mL of 30% $H_2O_2$ (aq) | 0.3 grams | 93.2 | |
| 59 | polyoxyethylene (20) sorbitan monolaurate detergent | Y | 0.3 mL | 90.8 | |
| 60 | polyoxyethylene (20) sorbitan monolaurate detergent | N | 0.3 mL | 21.8 | 69.0 |
| 61 | Poly(acrylic acid sodium salt) | Y | 0.3 grams | 87.7 | |
| 62 | Poly(acrylic acid sodium salt) | N | 0.3 grams | 75.6 | 12.1 |
| 63 | Potassium sorbate | Y | 0.3 grams | 88.4 | |
| 64 | Potassium sorbate | N | 0.3 grams | 43.7 | 44.6 |
| 65 | EDTA | Y | 0.3 grams | 95.9 | |
| 66 | EDTA | N | 0.3 grams | 97.7 | 1.8 |
| 67 | Potassium citrate monohydrate | Y | 0.3 grams | 78.4 | |
| 68 | Potassium citrate monohydrate | N | 0.3 grams | 96.2 | 17.8 |
| 69 | Sodium hexametaphosphate | Y | 0.3 grams | 90.5 | |
| 70 | Sodium hexametaphosphate | N | 0.3 grams | 91.0 | −0.5% |
| 71 | Polyvinylpyrrolidone | Y | 0.3 grams | 83.2 | |
| 72 | Polyvinylpyrrolidone | N | 0.3 grams | 54.0 | 29.3 |
| 73 | Ammonium polyacrylate polymer | Y | 0.3 mL | 86.9 | |
| 74 | Ammonium polyacrylate polymer | N | 0.3 mL | 80.5 | 6.4 |
| 75 | sorbitan monooleate | Y | 0.3 grams | 88.2 | |
| 76 | sorbitan monooleate | Y | 0.6 grams | 88.1 | | treatment on Example 85 significantly reduced QE. However, the addition of surface agents and $K_2HPO_4$ largely reversed the detrimental QE effects shown at Example 85.

TABLE 6

| Example | Surface agent | Amount of SA | QE |
|---|---|---|---|
| 77 | Ethylenediaminetetraacetic acid dipotassium salt dihydrate | 0.2 g | 93.4 |
| 78 | Ethylenediaminetetraacetic acid dipotassium salt dihydrate | 0.4 g | 95.4 |
| 79 | Ethylenediaminetetraacetic acid dipotassium salt dihydrate | 0.2 g | 99.0 |
| 80 | Potassium citrate tribasic monohydrate | 0.2 g | 93.5 |
| 81 | Potassium citrate tribasic monohydrate | 0.4 g | 93.5 |
| 82 | Potassium citrate tribasic monohydrate | 0.2 g | 99.0 |
| 83 | Sodium hexametaphosphate | 0.2 g | 88.7 |
| 84 | Sodium hexametaphosphate | 0.2 g | 98.7 |
| 85 | None (control) | NA | 18.8 |
| 86 | None (mother batch) | NA | 97 |

Additional testing results on samples 77-86 are provided at Table 7 below.

TABLE 7

| Example | D10/50/90 (μm) no sonication | Span no sonication | D10/50/90 (μm) with sonication | Span with sonication | ΔD50 | Δspan |
|---|---|---|---|---|---|---|
| 77 | 6.6/9.5/13 | 0.67 | 3.7/5.1/6.6 | 0.57 | 4.4 | 0.11 |
| 78 | 8.4/14.6/26.9 | 1.27 | 6.9/9.3/12.4 | 0.59 | 5.3 | 0.68 |
| 79 | 5.1/7/9.4 | 0.61 | 3.7/5/6.5 | 0.56 | 2 | 0.05 |
| 80 | 10.2/11/37.4 | 2.47 | 5.4/7.2/9.6 | 0.58 | 3.8 | 1.89 |
| 81 | 10.1/18.4/32.2 | 1.20 | 5.3/7.1/9.4 | 0.58 | 11.3 | 0.62 |
| 82 | 10.2/21.9/43.8 | 1.53 | 6.8/9.3/12.6 | 0.62 | 12.6 | 0.91 |
| 83 | 10.1/18.6/33.1 | 1.24 | 6.2/8.5/11.3 | 0.60 | 10.1 | 0.64 |
| 84 | 9.9/18.6/34.9 | 1.34 | 7.9/11.8/16.9 | 0.76 | 6.8 | 0.58 |
| 85 | 12.7/32.4/72.1 | 1.83 | 11/19.2/26.2 | 0.79 | 13.2 | 1.04 |
| 86 | 11.1/26.6/59.2 | 1.81 | 9/13.6/20.2 | 0.82 | 13 | 0.98 |

At table 7, the first column is the Example number. The second column shows the secondary particle sizes as measured without sonication. The third column shows the span with no sonication. Span measures the width of the particle size distribution. In the third column, Examples 85 and 86, which were not treated with surface active agents, showed a relatively large span. Except for Example 80, the examples with surface active agents showed a decrease in span relative to Examples 85 and 86, which means that they showed better dispersion and less agglomeration since the spread of particle sizes was narrower. In the fourth column is information on secondary particle size with sonication. In the fifth column is information on the span for the samples with sonication. Even with sonication, which improves dispersion and reduces agglomeration, the samples with surface agents decreased the span relative to samples 85 and 86, which shows the improvement in dispersion and the decrease in agglomeration. Column 6 shows the change in D50 (ΔD50) between non-sonication and sonication. The ΔD50 is also related to the degree of dispersion and agglomeration since a greater ΔD50 means that the sonication had more of an effect on dispersion and agglomeration. Examples 85 and 86 had greater ΔD50 than all of the samples which received surface agent treatment, which means that the examples with the surface treatment improved dispersion and reduced agglomeration.

Examples 87-95

Example 87

Example 87 contained $K_2SiF_6:Mn^{4+}$ without any stabilizing treatment and which was also not exposed to a water test. This is the control used in conjunction with examples 88-95.

Examples 88-95

Examples 88-95 were carried out to determine the effect of liquid water exposure of $K_2SiF_6:Mn^{4+}$ in the presence of $AlPO_4$. 1.2 g samples of $K_2SiF_6:Mn^{4+}$ was combined with, respectively, 3.6 mL of high purity deionized water, 0.39 M $K_2HPO_4$, 0.39 M $AlPO_4$, 0.39 M $AlPO_4$ plus 0.3 mL 30% $H_2O_2$, 0.1 M $AlPO_4$, 0.1 M $AlPO_4$ plus 0.3 mL 30% $H_2O_2$, 0.6 M $AlPO_4$, and 0.6 M $AlPO_4$ plus 0.3 mL of 30% $H_2O_2$. All samples were shaken briefly to mix and rolled at 40 rpm for 1 hr. The pH of each sample was recorded and then each was filtered and washed three times with acetone (50 mL total). The filter cakes were collected and dried under vacuum in a desiccator overnight. High purity deionized water was then added to the isolated powders in a 1 g powder:3 g water ratio in a new plastic bottle. These samples were shaken briefly to mix and rolled at 40 rpm for 1 hr. Each sample was filtered and washed three times with acetone (50 mL total) and the filter cakes were collected and dried under vacuum in a desiccator overnight. The results are shown in Table 8 below.

TABLE 8

| Example | Description | pH after rolling | QE | QE drop |
|---|---|---|---|---|
| 87 | 1.2 g PFS | N/A | 102.5% | N/A |
| 88 | 1.2 g PFS + 3.6 mL high purity deionized water | 2.87 | 39.4% | 63.1% |
| 89 | 1.2 g PFS + 3.6 mL 0.39M $K_2HPO_4$ | 7.76 | 99.7% | 2.8% |
| 90 | 1.2 g PFS + 3.6 mL 0.39M $AlPO_4$ | 1.68 | 99.3% | 3.2% |
| 91 | 1.2 g PFS + 3.6 mL 0.39M $AlPO_4$ + 0.3 mL 30% $H_2O_2$ | 1.34 | 86.1% | 16.4% |
| 92 | 1.2 g PFS + 3.6 mL 0.1M $AlPO_4$ | 1.60 | 64.5% | 38.0% |

TABLE 8-continued

| Example | Description | pH after rolling | QE | QE drop |
|---|---|---|---|---|
| 93 | 1.2 g PFS + 3.6 mL + 0.1M AlPO$_4$ + 0.3 mL 30% H$_2$O$_2$ | 1.38 | 75.6% | 26.9% |
| 94 | 1.2 g PFS + 3.6 mL + 0.6M AlPO$_4$ | 1.08 | 99.8% | 2.7% |
| 95 | 1.2 g PFS + 3.6 mL + 0.6M AlPO$_4$ + 0.3 mL 30% H$_2$O$_2$ | 1.21 | 98.1% | 4.4% |

The results above are consistent with other Examples in which treatment of K$_2$SiF$_6$:Mn$^{4+}$ with water causes a huge drop in QE and the treatment with K$_2$HPO$_4$ significantly improves the QE. ΔQE is the difference between the control (Example 87) and the remainder of the Examples (Examples 88-95). As is clear from the above data, the QE drop with the use of just water (Example 88) was 63.1%. Surprisingly, all other examples had a much smaller reduction of QE. The largest decrease was 38.0% which is still much smaller than the QE loss observed for Example 88. This further demonstrates the utility of the present invention in stabilizing phosphors against the detrimental effects of water. While exposure to K$_2$HPO$_4$ resulted in better QE values than AlPO$_4$, the treatment of both AlPO$_4$ and H$_2$O$_2$ resulted in similar performance as K$_2$HPO$_4$ alone. However, AlPO$_4$ at 0.39 M and 0.6 M nonetheless resulted in very good QE values even without H$_2$O$_2$.

Examples 96-100

Examples 96-100 are directed towards the improvement of phosphor robustness towards liquid water and water vapor upon treatment with MgF$_2$ with and without potassium hydrogen phosphate treatment. The starting K$_2$SiF$_6$:Mn$^{4+}$ phosphor powder had an average secondary d50 particle size of 12.3 μm as determined by light scattering.

Example 96

1 g of the starting K$_2$SiF$_6$:Mn$^{4+}$ phosphor was mixed with 3 g deionized water in a 15 mL plastic bottle. The mixture was shaken by hand for 15 seconds and then rolled at 40 rpm for 1 hour. The mixture was filtered on Whatman #4 filter paper and washed 4 times with a total of 100 mL acetone. The powder was dried under vacuum for 3 days.

Example 97

5 g of the starting phosphor of Example 96 was coated with MgF$_2$ using the amount of MgSiF$_6$.6H$_2$O precursor that produces MgF$_2$ in the amount of 1% by weight with respect to the starting phosphor, according to the procedure defined in Example 51. 1 g of the coated phosphor was mixed with 3 g deionized water in a 15 mL plastic bottle. The mixture was shaken by hand for 15 seconds and then rolled at 40 rpm for 1 hour. The mixture was filtered on Whatman #4 filter paper and washed 4 times with a total of 100 mL acetone. The powder was dried under vacuum for 3 days.

Example 98

5 g of the starting phosphor of Example 96 was coated with MgF$_2$ using the amount of MgSiF$_6$.6H$_2$O precursor that produces MgF$_2$ in the amount of 1% by weight with respect to the starting phosphor, according to the procedure defined in Example 51. After the residual HF solution was filtered off the product and rinsed 2× with acetone, the semi-dry cake was transferred back into the reaction beaker. To this solid was added 30 mL of 0.39M aqueous K$_2$HPO$_4$. The mixture was mixed at 140 rpm for 2 minutes. The slurry was transferred to a fresh plastic Buchner funnel fitted with a 0.7 μm paper membrane (Whatman GF/F). The aqueous solution was filtered off. The solid was washed with acetone 4× and then dried under vacuum. 1 g of this coated phosphor subsequently treated with K$_2$HPO$_4$ was mixed with 3 g deionized water in a 15 mL plastic bottle. The mixture was shaken by hand for 15 seconds and then rolled at 40 rpm for 1 hour. The mixture was filtered on Whatman #4 filter paper and washed 4 times with a total of 100 mL acetone. The powder was dried under vacuum for 3 days.

Example 99

5 g of the starting phosphor of Example 96 was coated with MgF$_2$ using the amount of MgSiF$_6$.6H$_2$O precursor that produces MgF$_2$ in the amount of 5% by weight with respect to the starting phosphor, according to the procedure defined in Example 51. 1 g of the starting phosphor was mixed with 3 g deionized water in a 15 mL plastic bottle. The mixture was shaken by hand for 15 seconds and then rolled at 40 rpm for 1 hour. The mixture was filtered on Whatman #4 filter paper and washed 4 times with a total of 100 mL acetone. The powder was dried under vacuum for 3 days.

Example 100

5 g of the starting phosphor of Example 96 was coated with MgF$_2$ using the amount of MgSiF$_6$.6H$_2$O precursor that produces MgF$_2$ in the amount of 5% by weight with respect to the starting phosphor, according to the procedure defined in Example 51. After the residual HF solution was filtered off the product and rinsed 2× with acetone, the semi-dry cake was transferred back into the reaction beaker. To this solid was added 30 mL of 0.39M aqueous K$_2$HPO$_4$. The mixture was mixed at 140 rpm for 2 minutes. The slurry was transferred to a fresh plastic Buchner funnel fitted with a 0.7 μm paper membrane (Whatman GF/F). The aqueous solution was filtered off. The solid was washed with acetone 4× and then dried under vacuum. 1 g of this coated phosphor subsequently treated with K$_2$HPO$_4$ was mixed with 3 g deionized water in a 15 mL plastic bottle. The mixture was shaken by hand for 15 seconds and then rolled at 40 rpm for 1 hour. The mixture was filtered on Whatman #4 filter paper and washed 4 times with a total of 100 mL acetone. The powder was dried under vacuum for 3 days.

After mixing the starting phosphor in water for 1 hour, the QE dropped from 99.9% to 16.8% as shown in Table 9 (Example 96). By comparison, the phosphor coated at the 1% MgF$_2$ level dropped down only to 77.6% (Example 97), and the phosphor coated at the 5% MgF$_2$ level only dropped down to 93.3% (Example 99). Incorporating treatment of the MgF$_2$-coated phosphor with aqueous K$_2$HPO$_4$, by simply mixing the MgF$_2$-coated product with 0.39M aqueous K$_2$HPO$_4$ for 2 minutes, resulted in an even more significant preservation of QE upon exposure to liquid water. When phosphor was coated with MgF$_2$ at the 1% level and then mixed with aqueous K$_2$HPO$_4$, the QE dropped only 1.3% upon mixing with pure water for one hour. Also shown by the data in Table 9 is the fact that the drop in QE associated with exposure to 85% relative humidity at 85° C. for 100 hours was much less with the MgF$_2$-coated phosphor particles compared to the starting phosphor. The QE drop upon exposure to humidity was reduced even further when the MgF$_2$-coated phosphor was treated with aqueous K$_2$HPO$_4$.

TABLE 9

| Example | Secondary particle size (μm) | QE before H$_2$O mixing | QE after mixing in H$_2$O for one hour | HTHH QE drop after 100 h |
|---|---|---|---|---|
| 96 | 12.3 | 99.9% | 16.8% | 43.6% |
| 97 | 8.8 | 99.5% | 77.6% | 30.3% |
| 98 | 9.9 | 99.8% | 98.5% | 16.7% |
| 99 | 10.8 | 99.6% | 93.3% | 19.4% |
| 100 | 9.7 | 99.0% | 99.7% | 16.9% |

As shown in Table 9, coating the phosphor with MgF$_2$ with and without subsequent treatment with aqueous K$_2$HPO$_4$ has three benefits: it enhances dispersibility, it enhances robustness against liquid water, and it enhances robustness against humidity at elevated temperature. These effects are enhanced further still in compositions of the present invention wherein the phosphor coated with MgF$_2$ is subsequently treated with aqueous K$_2$HPO$_4$.

The invention claimed is:

1. A phosphor composition comprising phosphor particles and comprising, on surfaces of the phosphor particles, at least one surface composition selected from the group consisting of: 1) a composition comprising a phosphorus-containing moiety and a carbon-containing moiety; 2) a composition comprising the phosphorus-containing moiety and a metal fluoride; 3) a composition comprising the phosphorus-containing moiety and the carbon-containing moiety and the metal fluoride; and 4) a composition comprising the phosphorus-containing moiety free of an alkyl phosphate compound, wherein the phosphor particles comprise a Mn$^{4+}$ doped phosphor of formula I;

$$A_x[MF_y]:Mn^{4+} \qquad I$$

wherein
A is Li, Na, K, Rb, Cs, or a combination thereof;
M is Si, Ge, Sn, Ti, Zr, Al, Ga, In, Sc, Y, La, Nb, Ta, Bi, Gd, or a combination thereof;
x is the absolute value of the charge of the [MF$_3$] ion;
y is 5, 6 or 7, and
wherein a D$_{50}$ particle size of the phosphor particles is from about 3.9 μm to about 10.0 μm.

2. The phosphor composition according to claim 1, wherein the phosphor of formula I is K$_2$SiF$_6$:Mn$^{4+}$ or Na$_2$SiF$_6$:Mn$^{4+}$.

3. The phosphor composition according to claim 1 further comprising one or more materials selected from the group consisting of: quantum dot materials, scattering particles, phosphorescent dyes, (Y,Gd,Tb,La,Sm,Pr,Lu)$_3$(Al,Ga)$_{5-a}$O$_{12-3/2a}$:Ce$^{3+}$ (wherein 0≤a≤0.5), β-SiAlON:Eu$^{2+}$, (Sr,Ca,Ba)(Al,Ga,In)$_2$S$_4$:Eu$^{2+}$, α-SiAlON doped with Eu$^{2+}$ and/or Ce$^{3+}$, Ca$_{1-h-r}$Ce$_h$Eu$_r$Al$_{1-h}$(Mg,Zn)$_h$SiN$_3$, (where 0≤h≤0.2, 0≤r≤0.2), Sr(LiAl$_3$N$_4$):Eu$^{2+}$, (Ca,Sr)S:Eu$^{2+}$, Ce$^{3+}$, (Ba,Sr,Ca)$_b$Si$_g$Nm:Eu$^{2+}$ (wherein 2b+4g=3m), U$^{6+}$-doped phosphors, and combinations thereof, and wherein the U$^{6+}$-doped phosphor is selected from the group consisting of: Ba$_6$Al$_{15}$P$_5$O$_{26}$: U$^{6+}$, Ba$_2$P$_2$O: U$^{6+}$, BaZn$_2$(PO$_4$)$_2$: U$^{6+}$ and BaBPO: U$^{6+}$.

4. A slurry composition comprising the phosphor composition of claim 1 randomly suspended in a silicone slurry.

5. A device comprising a light emitting diode radiationally coupled to a phosphor composition comprising phosphor particles and comprising, on surfaces of the phosphor particles, at least one surface composition selected from the group consisting of: 1) a composition comprising a phosphorus-containing moiety and a carbon-containing moiety; 2) a composition comprising the phosphorus-containing moiety and a metal fluoride; 3) a composition comprising the phosphorus-containing moiety and the carbon-containing moiety and the metal fluoride; and 4) a composition comprising the phosphorus-containing moiety free of an alkyl phosphate compound, wherein the phosphor particles comprise a Mn4+ doped phosphor of formula I;

$$Ax[MFy]:Mn4+ \qquad I$$

wherein A is Li, Na, K, Rb, Cs, or a combination thereof;
M is Si, Ge, Sn, Ti, Zr, Al, Ga, In, Sc, Y, La, Nb, Ta, Bi, Gd, or a combination thereof; x is the absolute value of the charge of the [MFy] ion; y is 5, 6 or 7, and
wherein a D50 particle size is from about 3.9 μm to about 10.0 μm.

6. The device according to claim 5, wherein the light emitting diode is a mini light emitting diode or a micro light emitting diode.

7. The device according to claim 5, wherein the light emitting diode is a UV or blue LED, and a) the phosphor composition is deposited on the UV or blue LED, or b) the phosphor composition is located remotely from the UV or blue LED.

8. A device according to claim 5, wherein the device is a display device.

9. A television comprising the display device of claim 8.

10. A smartphone comprising the display device of claim 8.

11. A computer monitor comprising the display device of claim 8.

12. A tablet comprising the display device of claim 8.

13. An automotive display comprising the device of claim 8.

14. A film comprising at least one phosphor composition comprising phosphor particles and comprising, on surfaces of the phosphor particles, at least one surface composition selected from the group consisting of: 1) a composition comprising a phosphorus-containing moiety and a carbon-containing moiety; 2) a composition comprising a metal fluoride; 3) a composition comprising the phosphorus-containing moiety and the metal fluoride; 4) a composition comprising the phosphorus-containing moiety and the carbon-containing moiety and the metal fluoride; and 5) a composition comprising the phosphorus-containing moiety free of an alkyl phosphate compound, wherein the phosphor particles comprise a Mn$^{4+}$ doped phosphor of formula I;

$$A_x[MF_y]:Mn^{4+} \qquad I$$

wherein A is Li, Na, K, Rb, Cs, or a combination thereof;
M is Si, Ge, Sn, Ti, Zr, Al, Ga, In, Sc, Y, La, Nb, Ta, Bi, Gd, or a combination thereof; x is the absolute value of the charge of the [MF$_y$] ion; y is 5, 6 or 7, and
wherein a D50 particle size is no greater than 30 μm.

15. The film according to claim 14, wherein the phosphor of formula I is K$_2$SiF$_6$:Mn$^{4+}$ or Na$_2$SiF$_6$:Mn$^{4+}$.

16. The film according to claim 14, wherein the metal fluoride is selected from the group consisting of calcium fluoride, strontium fluoride, magnesium fluoride, yttrium fluoride, scandium fluoride, and lanthanum fluoride.

17. The film according to claim 14, having a D$_{50}$ particle size from about 3.9 μm to about 10.0 μm.

18. The film according to claim 14 further comprising acrylate or silicone.

19. The film according to claim 14, wherein the phosphor composition further comprises one or more materials selected from the group consisting of: quantum dot materials, scattering particles, phosphorescent dyes, $(Y,Gd,Tb,La,Sm,Pr,Lu)_3(Al,Ga)_{5-a}O_{12-3/2a}:Ce^{3+}$ (wherein $0 \leq a \leq 0.5$), $\beta$-SiAlON:$Eu^{2+}$, $(Sr,Ca,Ba)(Al,Ga,In)_2S_4:Eu^{2+}$, $\alpha$-SiAlON doped with $Eu^{2+}$ and/or $Ce^{3+}$, $Ca_{1-h-r}Ce_hEu_rAl_{1-h}(Mg,Zn)_hSiN_3$, (where $0 \leq h \leq 0.2$, $0 \leq r \leq 0.2$), $Sr(LiAl_3N_4):Eu^{2+}$, $(Ca,Sr)S:Eu^{2+}$, $Ce^{3+}$, $(Ba,Sr,Ca)_bSi_gN_m:Eu^{2+}$ (wherein $2b+4g=3m$), $U^{6+}$-doped phosphors, and combinations thereof.

20. The film according to claim 19, wherein the $U^{6+}$-doped phosphor is selected from the group consisting of: $Ba_6Al_5P_5O_{26}$: $U^{6+}$, $Ba_2P_2O$: $U^{6+}$, $BaZn_2(PO_4)_2$: $U^{6+}$ and $BaBPO$: $U^{6+}$.

21. A device comprising a light emitting diode radiationally coupled to the film according to claim 14.

22. The device according to claim 21, wherein the light emitting diode is a mini light emitting diode or a micro light emitting diode.

23. The device according to claim 21, wherein the light emitting diode emits UV or blue light, and a) the film is disposed on the UV or blue LED, or b) the film is located remotely from the UV or blue LED.

24. A lighting apparatus comprising the device according to claim 21.

25. A backlight unit comprising the device according to claim 21.

26. A television comprising the device according to claim 21.

27. A mobile phone comprising the device according to claim 21.

28. A computer monitor comprising the device according to claim 21.

29. An automotive display comprising the device according to claim 21.

* * * * *